(12) United States Patent
Kuroda

(10) Patent No.: US 9,716,306 B2
(45) Date of Patent: Jul. 25, 2017

(54) DIRECTIONAL COUPLER AND COMMUNICATION DEVICE INCLUDING SAME

(71) Applicant: KEIO UNIVERSITY, Tokyo (JP)

(72) Inventor: Tadahiro Kuroda, Kanagawa (JP)

(73) Assignee: KEIO UNIVERSITY, Tokyo (JP)

( * ) Notice: Subject to any disclaimer, the term of this patent is extended or adjusted under 35 U.S.C. 154(b) by 57 days.

(21) Appl. No.: 14/904,462

(22) PCT Filed: Jul. 30, 2014

(86) PCT No.: PCT/JP2014/070118
§ 371 (c)(1),
(2) Date: Jan. 12, 2016

(87) PCT Pub. No.: WO2015/025690
PCT Pub. Date: Feb. 26, 2015

(65) Prior Publication Data
US 2016/0197393 A1    Jul. 7, 2016

(30) Foreign Application Priority Data
Aug. 19, 2013  (JP) ................................. 2013-169471

(51) Int. Cl.
*H01P 5/18*   (2006.01)
*H03H 7/38*   (2006.01)
(Continued)

(52) U.S. Cl.
CPC .................. *H01P 5/18* (2013.01); *H01P 5/10* (2013.01); *H01P 5/185* (2013.01); *H03F 3/60* (2013.01); *H03H 7/38* (2013.01)

(58) Field of Classification Search
CPC ..................................... H01P 5/18; H03H 7/28
(Continued)

(56) References Cited

U.S. PATENT DOCUMENTS 3,991,390 A * 11/1976 Conroy ..................... H01P 5/10
333/116
5,424,694 A    6/1995 Maloratsky et al.
(Continued)

FOREIGN PATENT DOCUMENTS

JP    2009-081856    4/2009
JP    2009-260444    11/2009
(Continued)

OTHER PUBLICATIONS

International Search Report mailed on Nov. 4, 2014.

*Primary Examiner* — Dean Takaoka
(74) *Attorney, Agent, or Firm* — IPUSA, PLLC

(57) ABSTRACT

A directional coupler including a first transmission line including a terminal part provided with a matched termination, and a front end part being an end portion on a side opposite to a side of the terminal part; a second transmission line electromagnetically coupled with the first transmission line; and a third transmission line electromagnetically coupled with the first transmission line, wherein each of the second and third transmission lines includes a near end and a far end, the near end being positioned on a side closer to the front end part when tracing the first transmission line from the front end part, the far end being positioned on a side farther from the front end part when tracing the first transmission line from the front end part, and wherein the near end is terminated to have an impedance smaller than a characteristic impedance of the second transmission line.

22 Claims, 28 Drawing Sheets

(51) Int. Cl.
*H01P 5/10* (2006.01)
*H03F 3/60* (2006.01)

(58) Field of Classification Search
USPC .................................. 333/109–112, 116, 25
See application file for complete search history.

(56) References Cited

U.S. PATENT DOCUMENTS

| | | | | |
|---|---|---|---|---|
| 6,483,415 | B1* | 11/2002 | Tang | H01F 17/0013 333/26 |
| 6,625,682 | B1* | 9/2003 | Simon | G06F 13/4086 333/109 |
| 6,788,164 | B2* | 9/2004 | Maekawa | H01P 1/20345 333/202 |
| 7,068,122 | B2* | 6/2006 | Weng | H01P 5/10 333/246 |
| 7,475,179 | B2* | 1/2009 | Osaka | G06F 13/4086 333/109 |
| 8,324,981 | B2* | 12/2012 | Ohi | H01P 5/10 333/238 |
| 8,502,620 | B2* | 8/2013 | Lu | H01F 21/12 333/246 |
| 8,981,870 | B2* | 3/2015 | Colleoni | H04L 25/0272 333/109 |
| 2009/0079522 | A1 | 3/2009 | Liang et al. | |
| 2009/0258617 | A1 | 10/2009 | Yoshihara | |
| 2013/0038387 | A1* | 2/2013 | Schmidhammer | G01R 27/06 327/563 |
| 2013/0324044 | A1 | 12/2013 | Kuroda et al. | |

FOREIGN PATENT DOCUMENTS

| | | |
|---|---|---|
| JP | 2011-072176 | 4/2011 |
| JP | 5213087 | 6/2013 |
| WO | 97/10622 | 3/1997 |
| WO | 2007/099202 | 9/2007 |

* cited by examiner

DIRECTIONAL COUPLER AND COMMUNICATION DEVICE INCLUDING SAME

TECHNICAL FIELD

The present invention relates to a directional coupler and a communication device communicating using the directional coupler.

BACKGROUND ART

A transmission method for transmitting digital signals includes a single end signal transmission and a differential signal transmission. In the differential signal transmission, noises applied in common to two lines offset each other. Therefore, a noise immunity is high. Therefore, a signal amplitude is made small to enable a high speed signal transmission. However, the amount of a signal line for the differential signal transmission is required to be two times the amount of a signal line for the single end signal transmission. Therefore, in a case where lines are disposed for many signals (in a case where a restriction of a cost, a volume, or a weight is strong) the single end signal transmission is frequently used.

On the other hand, a connector is used to electrically connect multiple modules, for example. Because a conventional connector has a structure of causing electrodes to be mutually attached by pressure, a problem of reliability or the like may occur.

As a means for solving this problem, a noncontact connector (an EM connector) including a directional coupler for transmitting a signal by an electromagnetic coupling is known. Because the directional coupler may cause only a high frequency signal component to pass, a pulse signal having a small amplitude is output when a digital signal is input. From the pulse signal, the original digital signal is recovered using a reception circuit including a comparison circuit and a signal hold circuit.

PRIOR ART DOCUMENT

Patent Document

[Patent Document 1] Japanese Patent No. 5213087

DISCLOSURE OF THE INVENTION

Problems to be Solved by the Invention

However, the signal amplitude of a signal output from the directional coupler strongly attenuates relative to the signal amplitude of a signal input into the directional coupler. Therefore, the signal transmission using the directional coupler involves a problem that a noise immunity is relatively low in comparison with the differential signal transmission in a manner similar to the problem in the single end signal transmission.

The object is to provide a directional coupler, in which a feature of the single end signal transmission and a feature of the differential signal transmission are provided so that a single end signal is transformable to a differential signal and the differential signal transformable to the single end signal, and a communication device including the directional coupler.

Means for Solving Problems

In order to attain the above objects, there are provided a directional coupler including a first transmission line including a terminal part provided with a matched termination, and a front end part which is an end portion on a side opposite to a side of the terminal part; a second transmission line electromagnetically coupled with the first transmission line; and a third transmission line electromagnetically coupled with the first transmission line, wherein each of the second transmission line and the third transmission line includes a near end and a far end, the near end being positioned on a side closer to the front end part when tracing the first transmission line from the front end part, the far end being positioned on a side farther from the front end part when tracing the first transmission line from the front end part, and wherein the near end of the second transmission line is terminated to have an impedance smaller than a characteristic impedance of the second transmission line, and a wireless device including the directional coupler.

Effect of the Invention

According to the embodiment of the present invention, a single end signal is transformable to a differential signal and the differential signal transformable to the single end signal.

MODE FOR CARRYING OUT THE INVENTION

A description is given below, with reference to FIG. 1 through FIG. 36 of embodiments of the present invention.

A description of embodiments of the present invention is given below with reference to figures. The "single end circuit" is a circuit configured to transmit or receive a single end signal. The "differential circuit" is a circuit configured to transmit or receive a differential signal.

Structure of Embodiment 1

Figure 1:
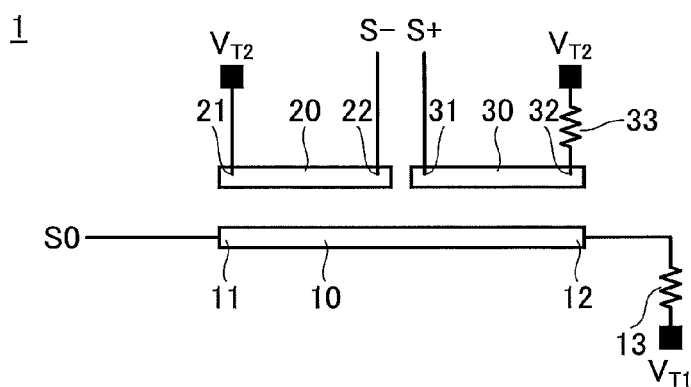
FIG. 1 illustrates an exemplary structure of a directional coupler.

FIG. 1 illustrates a structure of a directional coupler 1. The directional coupler 1 includes a first transmission line 10, a second transmission line 20, and a third transmission line 30.

The transmission line 10 includes a terminal part 12 provided with a matched termination and a front end part 11 being an end on a side opposite to the terminal part 12. The terminal part 12 is an end provided with a matched termination to have a termination voltage $V_{T1}$ by a terminal resistance 13, which has an impedance equal to a characteristic impedance Z of the transmission line 10. The termination voltage $V_{T1}$ is a half of a source voltage $V_{DD}$ of, for example, the single end circuit (a transmission circuit 16 described below) connected to the front end part 11.

The transmission line 20 is electromagnetically coupled with the transmission line 10. For example, the transmission line 20 includes a near end 21 and a far end 22. The near end 21 is positioned on a side near the front end part 11 when tracing from the front end part 11 through the transmission line 10, and the far end 22 is positioned on a side far from the front end part 11 when tracing from the front end part 11 through the transmission line 10.

For example, a distance from the front end part 11 through the transmission line 10 to a portion of the transmission line 10 closest to the far end 22 is longer than a distance from the front end part 11 through the transmission line 10 to a portion of the transmission line 10 closest to the near end 21. The "portion of the transmission line 10 closest to the far end 22" is a portion of the transmission line 10, for example, a center portion (a center portion of the transmission line 10) between the front end part 11 and the terminal part 12. The "portion of the transmission line 10 closest to the near end 21" is a portion of the transmission line 10, for example, the front end part 11.

The transmission line 30 is electromagnetically coupled with the transmission line 10. For example, the transmission line 30 includes a near end 31 and a far end 32. The near end 31 is positioned on a side near the front end part 11 when tracing from the front end part 11 through the transmission line 10, and the far end 32 is positioned on a side far from the front end part 11 when tracing from the front end part 11 through the transmission line 10. For example, a distance from the front end part 11 through the transmission line 10 to a portion of the transmission line 10 closest to the far end 32 is longer than a distance from the front end part 11 through the transmission line 10 to a portion of the transmission line 10 closest to the near end 31. The "portion of the transmission line 10 closest to the near end 32" is a portion of the transmission line 10, for example, the front end part 12. The "portion of the transmission line 10 closest to the far end 31" is a portion of the transmission line 10, for example, a center portion (a center portion of the transmission line 10) between the front end part 11 and the terminal part 12.

The transmission line 20 is arranged to face the transmission line 10 so that the transmission line 30 is close to the front end part 11. Each of the transmission line 20 and the transmission line 30 is arranged to face the transmission line 10 so as to be positioned close to the transmission line 10.

A minute gap exists between the far end 22 of the transmission line 20 and the near end 31 of the transmission line 30. However, it is preferable to arrange the transmission line 20 and the transmission line 30 so that the gap is not excessively great. When the gap is a predetermined value or smaller, the phase difference between the signal S− output from the far end 22 and the signal S+ output from the near end 31 may be easily caused to approach 180°.

Further, it is preferable to arrange the transmission line 20 and the transmission line 30 so that the transmission line 20 does not overlap the transmission line 30 in a facing direction where the transmission line 10 faces the transmission lines 20 and 30. Because the transmission line 20 does not overlap the transmission line 30, it is possible to prevent a degree of coupling between the transmission line 10 and the transmission line 20 or a degree of coupling between the transmission line 10 and the transmission line 30 from decreasing.

The near end 21 of the transmission line 20 is an end part provided with a short circuit termination to have a termination voltage $V_{T2}$. The far end 32 of the transmission line 30 is an end part provided with a matched termination to have the termination voltage $V_{T2}$ using a terminal resistance 33 having an impedance equal to the characteristic impedance Z of the transmission line 30. The transmission line 20 and/or the transmission line 30 has a characteristic impedance equal to the characteristic impedance Z of the transmission line 10. The termination voltage $V_{T2}$ is, for example, a half of the source voltage $V_{DD}$ of a differential circuit (a reception circuit 40 described below) connected to the far end 22 and the near end 31. The termination voltage $V_{T2}$ may be the same as or different from the termination voltage $V_{T1}$.

In this directional coupler 1, by inputting the single end signal S0 into the front end part 11, the far end 22 of the transmission line 20 may output a signal S− of a negative polarity and the near end 31 of the transmission line 30 may output a signal S+ of a positive polarity (described in detail later). The single end signal S0 is a signal having the crest of a wave of a rising waveform or a falling waveform. A pair of the signals S− and S+ is differential signals whose phases are mutually inverted. Said differently, the single end signal may be transformed to the differential signal.

On the contrary, with this directional coupler 1, the front end part 11 may output the single end signal S0 (as described in detail later) by inputting the signal S− of the negative polarity into the far end 22 of the transmission line 20 and inputting the signal S+ of the positive polarity into the near end 30 of the transmission line 30. The signals S− and S+ are signals having the crests of the waves of the rising waveform and the falling waveform, respectively, and differential signals having the mutually inverted phases. Said differently, the differential signal may be transformed to the single end signal.

Figure 2:
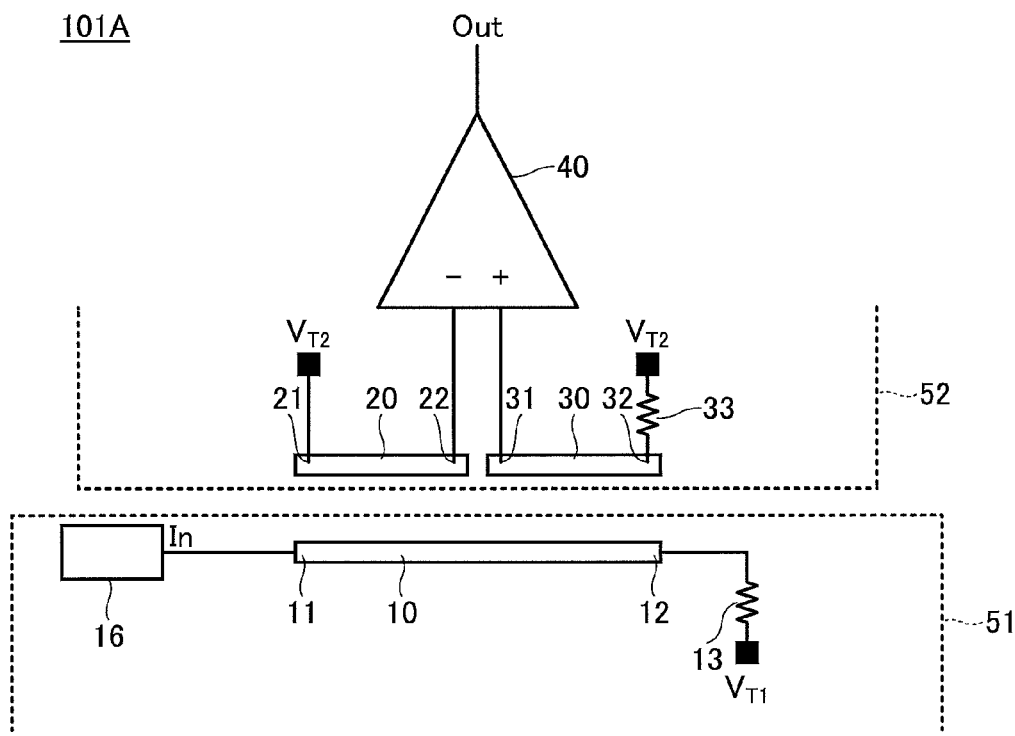
FIG. 2 illustrates an exemplary structure of a wireless device including the directional coupler.

FIG. 2 illustrates a structure of a communication device 101A including the directional coupler 1. The communication device 101A is a device for causing a module 51 and a module 52 to mutually communicate using the directional coupler 1 without a contact between the module 51 and the module 52.

The module 51 includes the transmission line 10, the terminal resistance 13, and a single end type transmission circuit 16 connected to the front end part 11. The single end type transmission circuit 16 connected to the front end part 11 is a single end circuit which may transmit the single end signal In input into the transmission line 10 from the front end part 11.

The module 52 includes the transmission line 20, the transmission line 30, the terminal resistance 33, and a differential type reception circuit 40 connected to the far end 22 of the transmission line 20 and the near end 31 of the transmission line 30. The reception circuit 40 is a differential circuit including a differential input circuit which may receive the differential signals output from the far end 22 and the near end 31. The reception circuit 40 outputs a single end signal Out corresponding to the differential signals received by the differential input circuit, for example.

The module is a device which performs a noncontact communication with the other module through the directional coupler, and includes a reception part for receiving a signal and/or a transmission part for transmitting the signal. As an example, the module is a packaged semiconductor device, and the other module is a board having the transmission line. However, this is simply one example. Further, the present invention includes a case where the one module and the other module are formed on the same circuit board.

Figure 3:
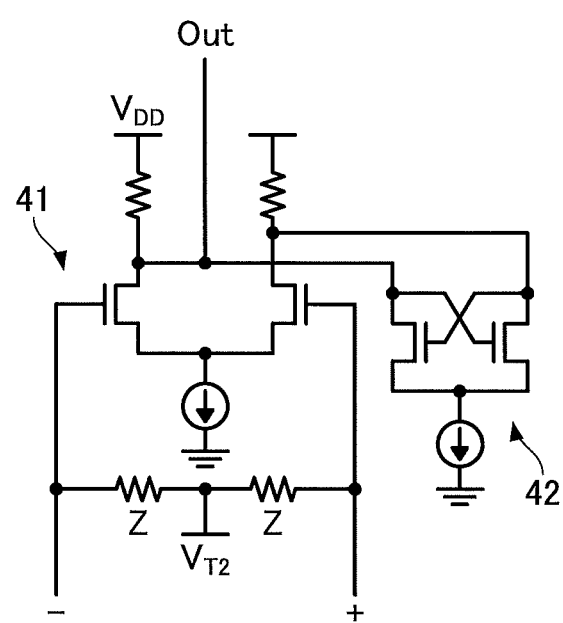
FIG. 3 illustrates an exemplary structure of a differential circuit.

FIG. 3 illustrates a first structural example of the reception circuit 40. The reception circuit 40 includes a comparison circuit 41 and a signal hold circuit 42. The comparison circuit 41 is the differential input circuit which may receive the differential signals. The signal hold circuit 42 is a hysteresis circuit holding an output signal from the comparison circuit 41. Referring to FIG. 3, the reception circuit 40 recovers an original digital signal from the received differential signal by using the comparison circuit 41 and the signal hold circuit 42.

Figure 4:
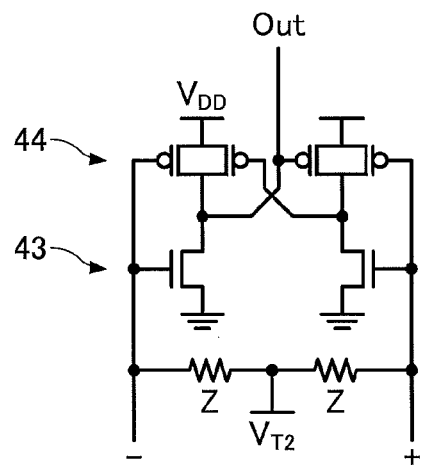
FIG. 4 illustrates an exemplary structure of a differential circuit.

FIG. 4 illustrates a second structural example of the reception circuit 40. The reception circuit 40 includes a comparison circuit 43 and a signal hold circuit 44. The comparison circuit 43 is the differential input circuit which may receive the differential signals. The signal hold circuit 44 is a hysteresis circuit holding an output signal from the comparison circuit 43. Referring to FIG. 4, the reception circuit 40 recovers the original digital signal from the received differential signal by using the comparison circuit 43 and the signal hold circuit 44.

Figure 5:
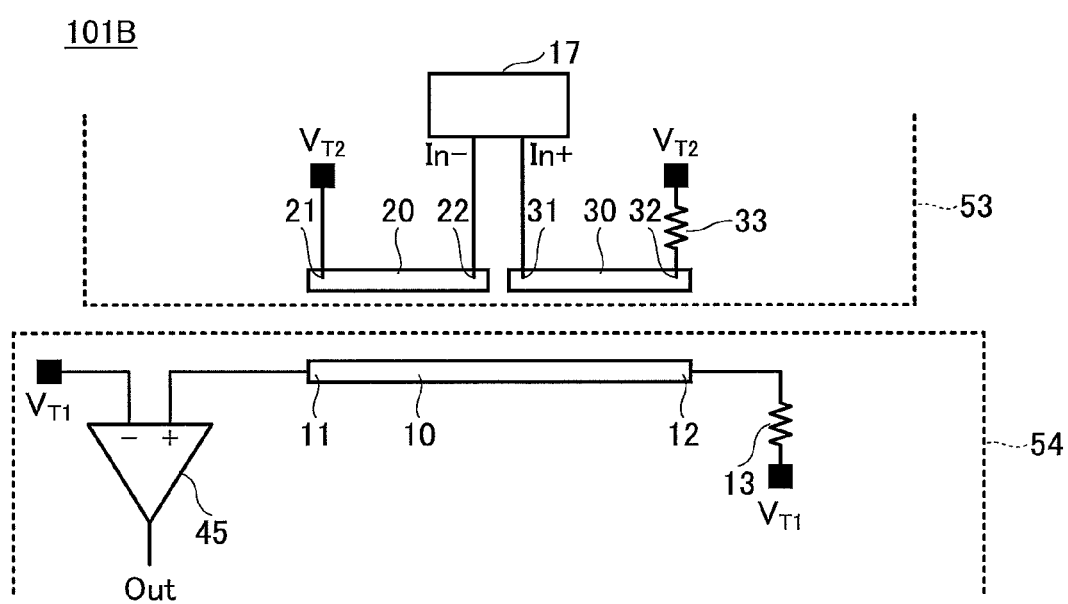
FIG. 5 illustrates an exemplary structure of the wireless device including the directional coupler.

FIG. 5 illustrates a structure of a communication device 101B including the directional coupler 1. The communication device 101B is a device for causing a module 53 and a module 54 to mutually communicate using the directional coupler 1 without a contact between the module 51 and the module 52.

The module 53 includes the transmission line 20, the transmission line 30, the terminal resistance 33, and the reception circuit 17 connected to the far end 22 of the transmission line 20 and the near end 31 of the transmission line 30. The differential type transmission circuit 17 is a differential circuit which may transmit a differential signal input from the far end 22 and near end 31 to the transmission lines 20 and 30. The differential type transmission circuit transmits a differential signal including an input signal In− of the negative polarity and an input signal In+ of the positive polarity. The phases of the input signal In− and the input signal In+ mutually invert.

The module 54 includes the transmission line 10, the terminal resistance 13, and a reception circuit 45 connected to the front end part 11. The reception circuit 45 is a differential type differential circuit 45 including a differential input circuit including a non-inverting input portion (+) connected to the front end part 11 and an inverting input portion (−) connected to the termination voltage $V_{T1}$. The reception circuit 45 is a circuit which may receive the single end signal output from the front end part 11. The reception circuit 45 outputs the single end signal Out corresponding to a potential difference between the potential of the single end signal output from the front end part 11 and the termination voltage $V_{T1}$.

<Operating Principle of Directional Coupler>

Figure 6:
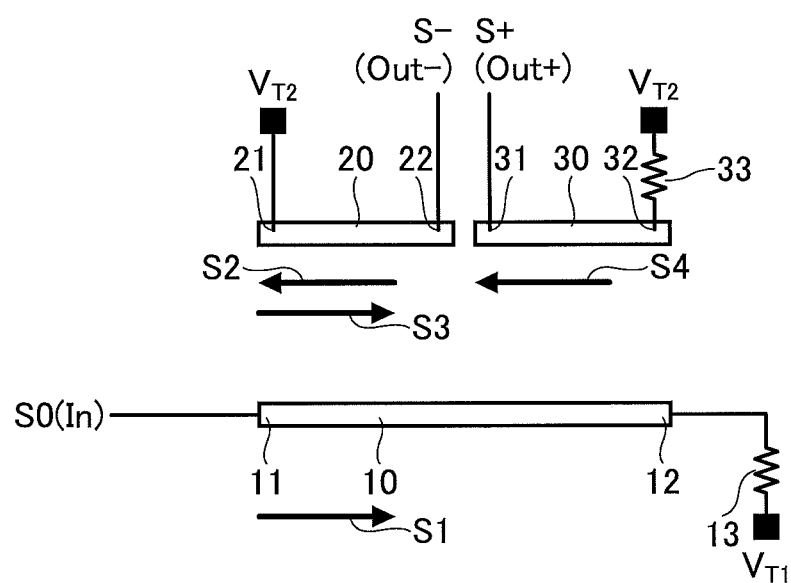
FIG. 6 illustrates an operating principle of the directional coupler.
Figure 7:
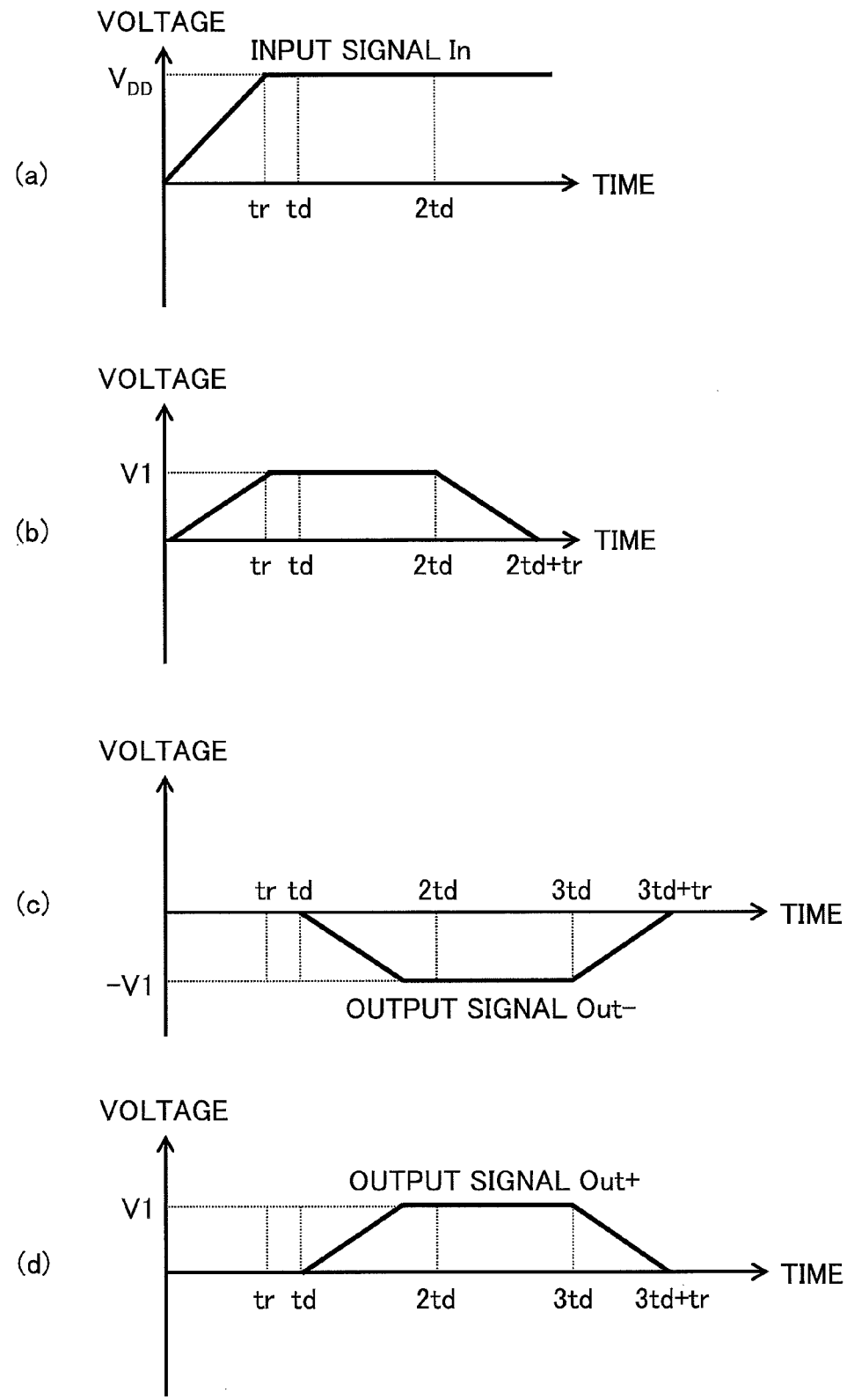
FIG. 7 illustrates waveforms in various portions of the directional coupler.

FIG. 6 illustrates a structure of the directional coupler 1. FIG. 7 illustrates waveforms in various portions of the directional coupler. Referring to FIGS. 6-7, an operating principle of the directional coupler is described.

Referring to FIG. 7, (a) illustrates a waveform of the signal S1 travelling in a direction from the front end part 11 to the terminal part 12 after the input signal In is input into the front end part 11. When the input signal In propagates from the front end part 11 to the terminal part 12 through the transmission line 10, a current and a voltage of the propagating signal change at a crest of a wave. Between the transmission line 10 and the transmission line 20 and between the transmission line 10 and the transmission line 30, a mutual capacitance C and a mutual inductance M sequentially exist. Due to coupling actions of i=C(dv/dt) and v=L(di/dt), a capacitive coupling current and an inductive coupling current are derived and flow through the transmission line 20 and the transmission line 30.

Regarding the capacitive coupling current, after an induced current flows from the transmission line 10 to the transmission line 20, because characteristic impedances of the transmission line 20 on right and left sides from a point where the induced current flows are equal, the capacitive coupling current equally separated right and left so as to be shunt flows towards both ends. Said differently, a half of the capacitive coupling current flows backward to the near end 21 and the other half flows forward to the far end 22.

The signal flowing backward to the near end 21 flows backward through the transmission line 20 at the same speed as a speed at which the crest of the wave being the current signal source flows forward from the front end part 11 to the terminal part 12 through the transmission line 10.

Said differently, the signal completely enters into the transmission line 10 after a rise time tr of the wave after the crest of the wave propagating through the transmission line 10 is input into the front end part 11. While the crest of the wave propagates to a center portion (a portion of the transmission line 10 facing the far end 22 and the near end 31) of the transmission line 10, a half of the induced current output from the current signal source flowing forward to the center portion of the transmission line 10 flows backward toward the near end 21 at the same speed. Therefore, a current value at the near end 21 is constant. Provided that the input signal In propagates from the front end part 11 to the center portion of the transmission line 10 at a time td, the half of the induced current in the transmission line 20 returns at the time when the signal reaches the center portion of the transmission line 10 and flows backward to the near end 21 during the time td. Therefore, the signal appearing at the near end 21 is a pulse signal having a time width $2td$.

Further, the other half of the current flowing forward toward the far end 22 reaches the far end 22 while increasing the current along the current signal source flows forward to the center portion of the transmission line 10.

Meanwhile, the inductive coupling current is a current flowing by a voltage source induced by inductive coupling in the transmission line 20. The direction of the inductive coupling current is inverse to a current loop of the transmission line 10 and is macroscopically from the far end 22 to the near end 21.

Therefore, a signal generated at the near end 21 due to the inductive coupling and a signal generated at the near end due to the capacitive coupling have the same symbol so as to mutually stress. Therefore, the signal appearing at the near end 21 has a waveform illustrated in (b) of FIG. 7. Referring to (b) of FIG. 7, the waveform of a signal S2 flows from the far end 22 to the near end 21 along with the propagation of a signal S1 from the transmission line 10 to the transmission line 20.

However, because the near end 21 is provided with a short circuit termination, the signal S2 undergoes a total reflection at the near end 21. Therefore, a reflective wave cancelling the signal S2 is generated at the near end 21. The reflective wave generated at the near end 21 flows in a direction from the near end 21 to the far end 22. The time td passes while the reflective wave flows from the near end 21 to the far end 22. Therefore, a signal appearing at the far end 22 has a waveform illustrated in (c) of FIG. 7. Referring to (c) of FIG. 7, illustrated is the waveform at the far end 22 of a signal S3 flowing in a direction from the near end 21 to the far end 22 after the signal S2 undergoes the total reflection at the near end 21. Said differently, a pulse signal Out− of the negative polarity is output from the far end 22.

On the other hand, the crest of the wave of the signal propagating through the transmission line 10 starts to pass through the center portion of the transmission line 10 after a passage of the time td after the crest of the wave is input into the front end part 11. While the crest of the wave propagates from the center portion of the transmission line 10 to the terminal part 12, a phenomenon similar to a phenomenon where a capacitive coupling current and an inductive coupling current flow through the transmission line 20 is generated.

Therefore, a signal appearing at the near end 31 of the transmission line 30 has a waveform illustrated in (d) of FIG. 7. Referring to (d) of FIG. 7, the waveform of a signal S4 flows from the far end 32 to the near end 31 along with the propagation of a signal S1 from the transmission line 10 to the transmission line 30. Said differently, a pulse signal Out+ of the positive polarity is output from the near end 31.

As described, the directional coupler may output the differential signal including the pulse signal Out− of the negative polarity and the signal Out+ of the positive polarity having a phase inverted by 180° relative to the phase of the pulse signal Out−. Said differently, the single end signal may be transformed to the differential signal. On the contrary, in a case where the differential signal is input into the far end 22 and the near end 31, a manner similar to the above is applicable. Therefore, the differential signal may be transformed into the single end signal.

<Operation Simulation of Directional Coupler>

Figure 8:
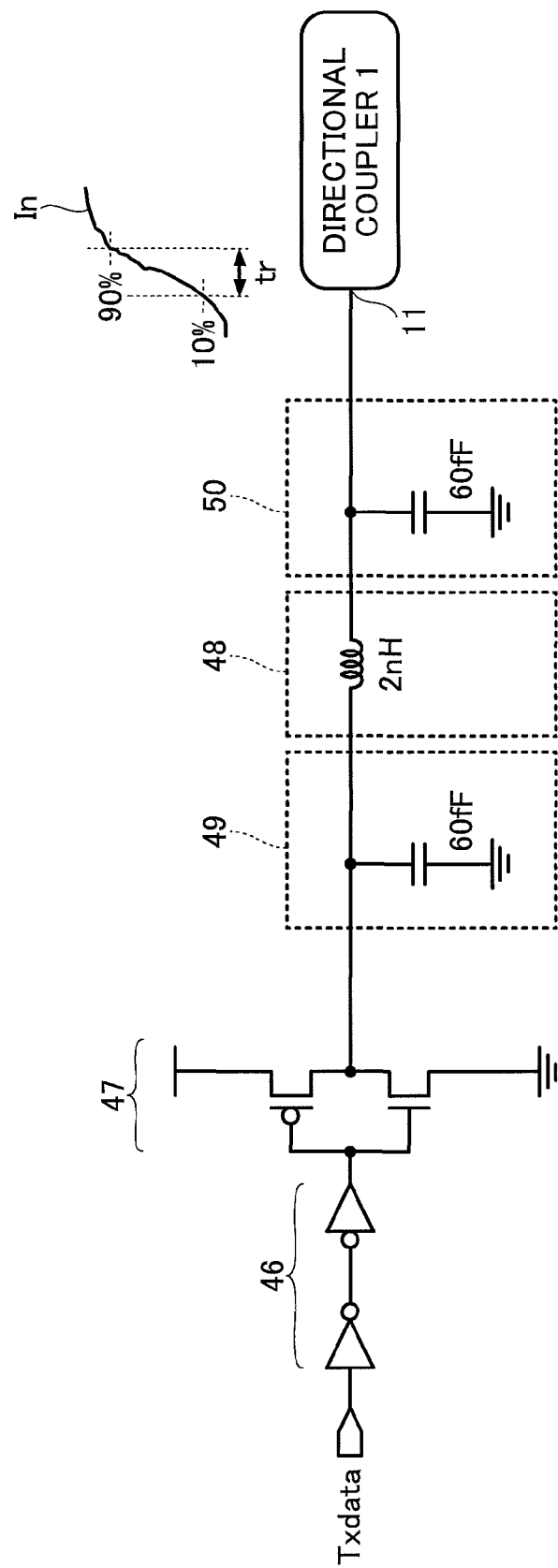
FIG. 8 illustrates a simulation circuit.

Described next is a simulation result obtained by a computer at a time when the directional coupler of the embodiment is operated. FIG. 8 illustrates a transmission circuit used for the simulation. This transmission circuit is a circuit for generating a single end signal In input into the front end part 11 of the directional coupler 1 and includes a predriver 46 and a 50 ohm driver 47.

An inductance 48 designates an inductance component of a bonding wire connecting the transmission circuit and the front end part 11. A capacitance 49 designates a parasitic capacitance of a pad for connecting the transmission circuit and the bonding wire. A capacitance 50 designates a parasitic capacitance of a pad for connecting the transmission circuit and the bonding wire.

In this simulation, the setting is as follows.

The length of the bonding wire connecting the transmission circuit and the front end part 11: 2 mm;

The inductance of the bonding wire connecting the transmission circuit and the front end part 11: 2 nH;

The capacitances 49 and 50: 60 f F;

The line widths of the transmission line 10 and the transmission lines 20 and 30: 500 μm;

The line lengths of the transmission line 10 and the transmission lines 20 and 30: 5 mm;

The distances (communication distances) between the transmission line 10 and the transmission lines 20 and 30: 0.1 mm;

The relative permittivity of a medium between the transmission line 10 and the transmission lines 20 and 30: 3.4;

The relative permittivity of a dielectric board on which the transmission line 10 and the transmission lines 20 and 30 are formed: 3.4;

The characteristic impedances of the transmission line 10 and the transmission lines 20 and 30: 50Ω; and The impedances of the terminal resistances 13 and 33: 50Ω.

Figure 9:
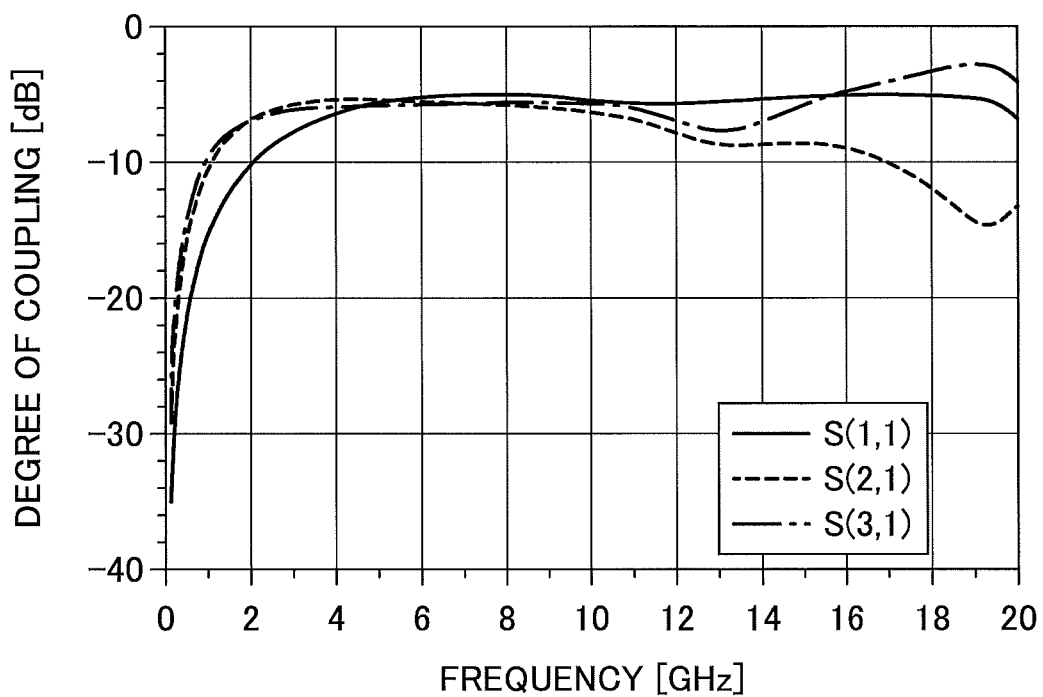
FIG. 9 is a graph indicating a simulation result of the directional coupler.

FIG. 9 illustrates a simulation result (an S parameter) of a degree of coupling in the directional coupler 1. An input reflection coefficient at the front end part 11 is designated by S(1, 1). A transmission coefficient from the front end part 11 to the near end 31 of the transmission line 30 is designated by S(2, 1). A transmission coefficient from the front end part 11 to the far end 31 of the transmission line 20 is designated by S(3, 1). As illustrated in FIG. 9, the directional coupler 1 has a predetermined degree of coupling in a wide frequency range.

Figure 10:
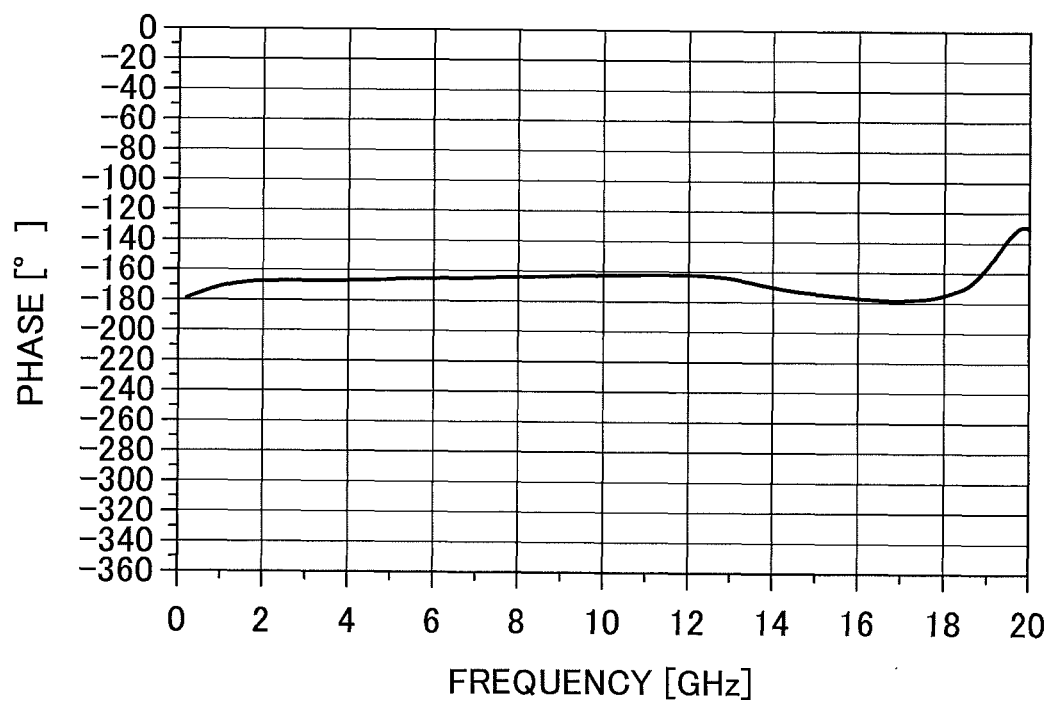
FIG. 10 is a graph indicating a simulation result of the directional coupler.

FIG. 10 illustrates a simulation result of a phase difference of the differential signal output from the directional coupler 1. As illustrated in FIG. 10, a phase shift of 180° is obtainable in a wide frequency range depending on the directional coupler 1.

Figure 11:
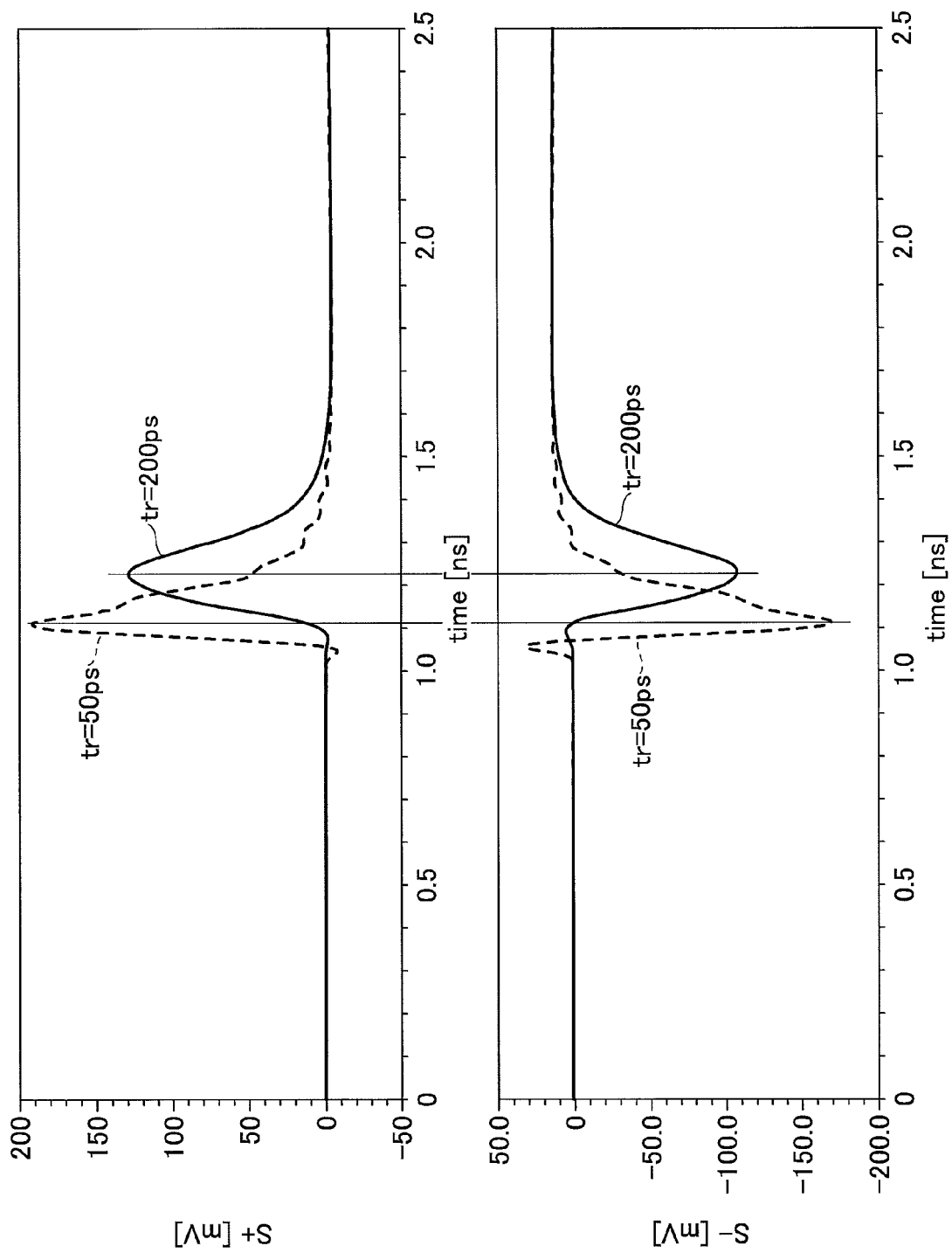
FIG. 11 is a graph indicating a simulation result of the directional coupler.

FIG. 11 illustrates a simulation result of the differential signal output from the directional coupler 1 when a single end signal of an amplitude of 600 mV is input into the front end part 11. The signal S+ is a signal output from the near end 31 of the transmission line 30, and the signal S− is a signal output from the far end 22 of the transmission line 20. In both of the rise times of 50 ps and 200 ps, the phases of the signal S+ and the signal S− accurately invert, and the amplitudes of the signal S+ and the signal S− are substantially the same.

Layout of Embodiment 1

Figure 12:
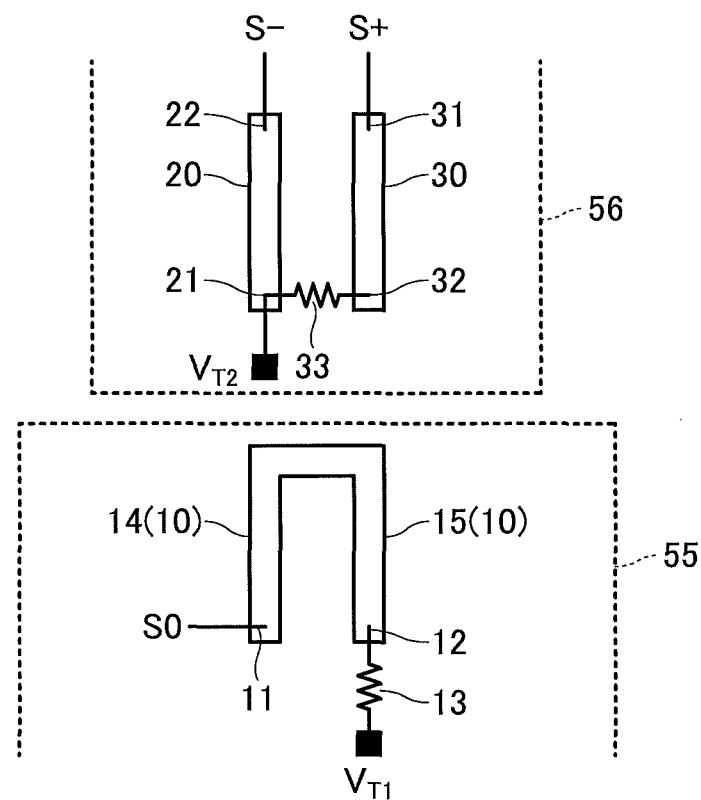
FIG. 12 illustrates an exemplary layout of the directional coupler.

FIG. 12 illustrates a structure of a communication device 101C including the directional coupler 1 and a layout example of the directional coupler 1. The communication device 101C is a device for causing a module 55 and a module 56 to mutually communicate using the directional coupler 1 without a contact between the module 55 and the module 56.

The module 55 includes the transmission line 10, the terminal resistance 13, and a single end type single end circuit connected by the front end part 11. The transmission line illustrated in FIG. 12 is a turnover line formed to bend in a U-like shape and includes a transmission line part 14 and a transmission line part 15.

The module 56 includes the transmission line 20, the transmission line 30, the terminal resistance 33, and a differential type differential circuit connected to the far end 22 of the transmission line 20 and the near end 31 of the transmission line 30.

Referring to FIG. 12, the module 55 and the module 56 are arranged in parallel to facilitate visualization for convenience. However, the module 55 and the module 56 are provided with a lamination arrangement in a direction perpendicular to the paper surface of FIG. 12. The direction perpendicular to the paper surface of FIG. 12 (namely, a direction of laminating the modules) is simply referred to as a "lamination direction".

Said differently, in the lamination direction of the module 55 and the module 56, the transmission line part 14 and the transmission line 20 are arranged to face each other so as to be able to electromagnetically coupled, and the transmission line part 15 and the transmission line 30 are arranged to face each other so as to be electromagnetically coupled. Further, in the lamination direction of the module 55 and the module 56, the front end part 11 of the transmission line part 14 and the near end 21 of the transmission line 20 are arranged to face each other, and the terminal part 12 of the transmission line part 15 and the far end 32 of the transmission line 30 are arranged to face each other.

By arranging the transmission line parts 14, 15, 20, and 30 to face as described above, and by connecting the near end 21 to the far end 32 through the terminal resistance 33, the termination voltage may be determined at one place.

Modified Example of Embodiment 1

Figure 13:
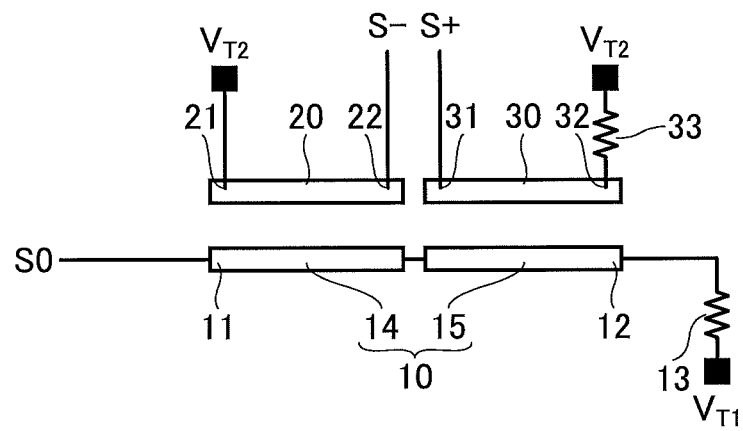
FIG. 13 illustrates a modified example of the directional coupler.

FIG. 13 illustrates a modified example of the directional coupler. Referring to FIG. 13, the transmission line 10 is separated into a transmission line part 14 and a transmission line part 15, and the transmission line part 14 and the transmission line part 15 may be connected by a line. The transmission line part 14 and the transmission line 20 are arranged to face each other so as to electromagnetically couple, and the transmission line part 15 and the transmission line 30 are arranged to face each other so as to be able to electromagnetically couple. With the above structure, when a way of connecting the lines to the transmission line part is changed, the termination voltage, the terminal resistance, and so on, a differential method or a single end method in the directional coupler is easily interchangeable.

Referring to FIG. 13, in a case where the transmission lines 20 and 30 are not connected and the transmission line parts 14 and 15 are connected through the line, the transmission method on the side of the transmission line parts 14 and 15 may be changed to the single end method, and the transmission method on the side of the transmission lines 20 and 30 may be changed to the differential method. Opposite to FIG. 13, in a case where the transmission line parts 14 and 15 are not connected and the transmission lines 20 and 30 are connected, the transmission method on the side of the transmission lines 20 and 30 may be changed to the single end method, and the transmission method on the side of the transmission line parts 14 and 15 may be changed to the differential method.

Structure of Embodiment 2

In the directional coupler 1 illustrated in FIG. 1, the transmission line 20 and/or the transmission line 30 may have a characteristic impedance Z1 different from the characteristic impedance Z of the transmission line 10. Further, the impedance of the terminal resistance 33 may be caused to match the impedance Z1 of the transmission line 30. For example, the impedance Z1 may be greater than the impedance Z. Specifically, the following relationship may be set: Z=50Ω and Z1=75Ω. A small mismatch between the impedances of the transmission line parts which electromagnetically couple does not interrupt in transforming the single end signal to the differential signal or in transforming the differential signal to the single end signal.

Structure of Embodiment 3

In the directional coupler 1 illustrated in FIG. 1, even though the far end 32 of the transmission line 30 is not provided with the matched termination, a great reflection interruption is not caused. Especially, in a case where a signal propagating from the transmission line 10 to the near end 31 of the transmission line 30 is great and a signal propagating from the transmission line 10 to the far end 32 of the transmission line 30 is small (a directionality strongly appears), even if the far end 32 is not provided with the matched termination to reflect the signal, an influence of the signal reflection is too small to cause the interruption. Therefore, the impedance Z3 of the terminal resistance 33 may be different from the characteristic impedance Z of the transmission line 30. For example, the impedance Z3 of the terminal resistance 33 may be smaller than the characteristic impedance Z of the transmission line 30. Specifically, the following relationship may be set: Z=50Ω and Z3=25Ω. For example, the far end 32 may be provided with the short circuit termination (Z3=0Ω) like the directional coupler 3 illustrated in FIG. 14.

Layout of Embodiment 3

Figure 15:
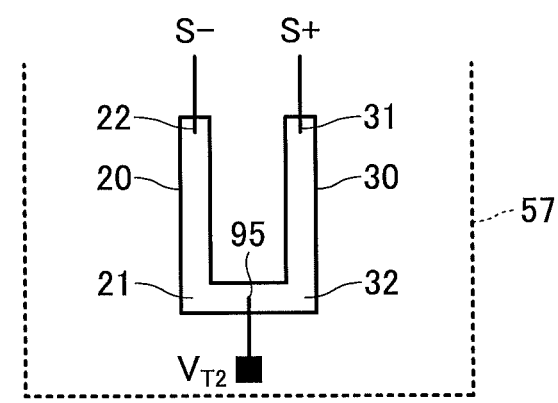
FIG. 15 illustrates an exemplary layout of the directional coupler.
Figure 15:
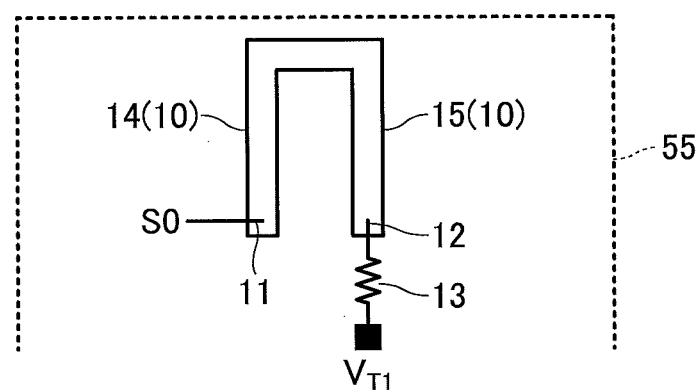

FIG. 15 illustrates a structure of a communication device 103 including the directional coupler 3 and a layout example of the directional coupler 3. The communication device 103 is a device for causing the module 55 and a module 57 to mutually communicate using the directional coupler 3 without a contact between the module 55 and the module 57. However, the module 55 and the module 57 are provided with a lamination arrangement in a direction perpendicular to the paper surface of FIG. 15 in a manner similar to FIG. 12.

Figure 14:
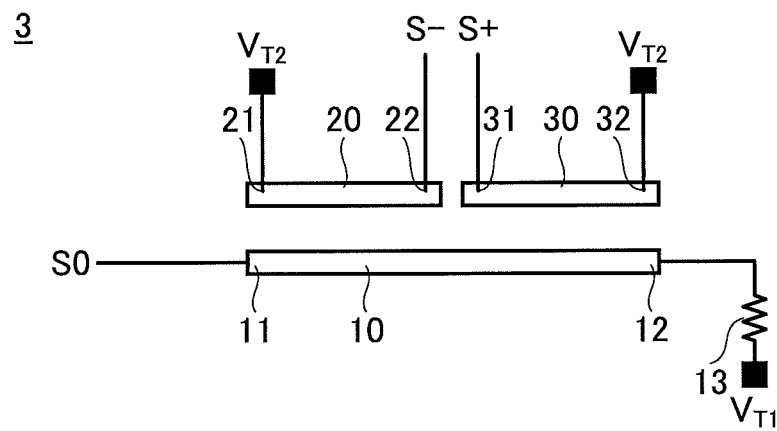
FIG. 14 illustrates an exemplary structure of the directional coupler.

When the far end 32 is provided with the short circuit termination like the directional coupler 3 illustrated in FIG. 14, a layout of the transmission line part formed by the directional coupler 3 becomes the same on the transmission side and on the reception side. With the above structure, when a way of connecting the lines to the transmission line part is changed, the termination voltage, the terminal resistance, and so on, the differential method or the single end method in the directional coupler is easily interchangeable.

Referring to FIG. 15, the near end 21 and the far end 32 are connected, and a connection part 95 connecting the near end 21 and the far end 32 is provided with the short circuit termination so as to have the termination voltage $V_{T2}$.

The module 55 includes the transmission line 10, the terminal resistance 13, and a single end type single end circuit connected by the front end part 11. The transmission line illustrated in FIG. 15 is a turnover line formed to bend in a U-like shape and includes the transmission line part 14 and the transmission line part 15.

The module 57 includes the transmission line 20, the transmission line 30, and a differential type differential circuit connected to the far end 22 of the transmission line 20 and the near end 31 of the transmission line 30. The transmission line on a side of the module 57 is formed to connect the near end 21 of the transmission line 20 and the far end 32 of the transmission line 30 and is a turnover line bent in a U-like shape.

A first U-like shaped transmission line is formed by connecting the transmission line part 14 and the transmission line part 15, and a second U-like shaped transmission line is formed by connecting the transmission line part 20 and the transmission line part 30. When the first U-like shaped transmission line and the second U-like shaped transmission line are viewed so as to project in a lamination direction of laminating the first U-like shaped transmission line and the second U-like shaped transmission line, the first U-like shaped transmission line and the second U-like shaped transmission line are arranged to face to be able to electromagnetically couple so that only one of the U-like shaped transmission lines is inverted upside down (in a manner similar to FIG. 20).

Structure of Embodiment 4

Figure 16:
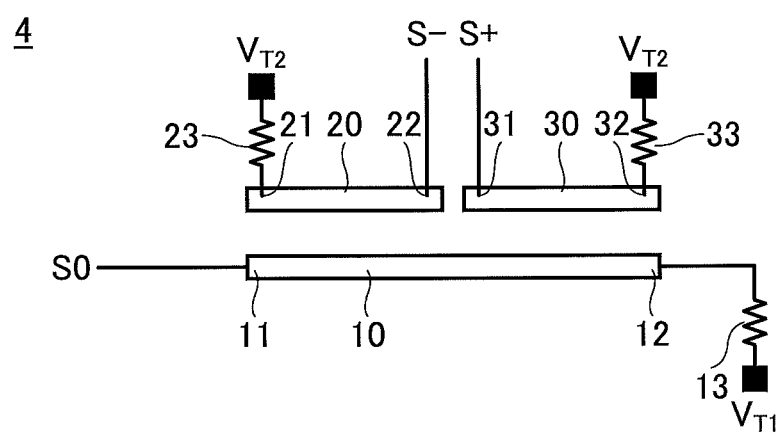
FIG. 16 illustrates an exemplary structure of the directional coupler.

In the directional coupler 1 illustrated in FIG. 1, even though the near end 21 of the transmission line 20 is not provided with the short circuit termination, a great reflection interruption is not caused. Especially, in a case where a signal propagating from the transmission line 10 to the near end 21 of the transmission line 20 is great and a signal propagating from the transmission line 10 to the far end 32 of the transmission line 30 is small (a directionality strongly appears), even if the near end 21 is not provided with the short circuit termination to reflect the signal, an influence of the signal reflection is too small to cause the interruption. Therefore, the near end 21 may be terminated to have an impedance smaller than the characteristic impedance Z of the transmission line 20. FIG. 16 illustrates a structure of the directional coupler 4 whose near end 21 is terminated to have the termination voltage $V_{T2}$ by a terminal resistance having an impedance Z2 smaller than the characteristic impedance Z of the transmission line 20.

Provided that the characteristic impedance of the transmission line 20 is Z and the impedance of the terminal resistance 23 is Z2, a reflection coefficient A at the near end when the input signal is input from the transmission line 20 to the terminal resistance 23 is as follows.

$A=(Z2-Z1)/(Z2+Z1)$

Therefore, in the directional coupler 4, the reflection coefficient A is a negative value greater than −1 and smaller than 0. When the impedance Z2 of the terminal resistance 23 is set to 0Ω, the reflection coefficient A of the directional coupler 4 becomes the same as the reflection coefficient of −1 of the directional coupler 1 illustrated in FIG. 1.

Therefore, the impedance Z3 of the terminal resistance 33 may be different from the characteristic impedance Z of the transmission line 30. For example, the impedance Z3 of the terminal resistance 33 may be smaller than the characteristic impedance Z of the transmission line 30.

Layout of Embodiment 4

Figure 17:
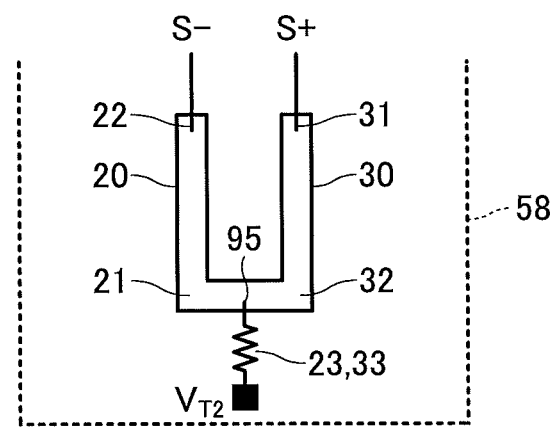
FIG. 17 illustrates an exemplary layout of the directional coupler.
Figure 17:
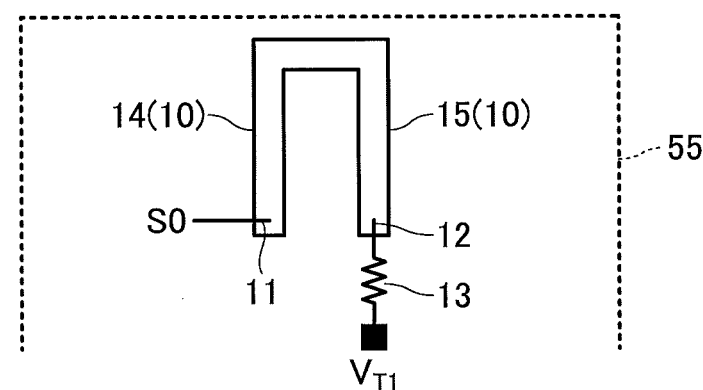

FIG. 17 illustrates a structure of a communication device 104 including the directional coupler 4 and a layout example of the directional coupler 4. The communication device 104 is a device for causing the module 55 and a module 58 to mutually communicate using the directional coupler 4 without a contact between the module 55 and the module 58. Also in the communication device 104, the module 55 and the module 58 are provided with a lamination arrangement in a direction perpendicular to the paper surface of FIG. 17 in a manner similar to FIG. 12.

In the directional coupler 4 illustrated in FIG. 16, the impedances of the terminal resistances 23 and 33 are made the mutually equal impedance Z2 smaller than the characteristic impedance Z of the transmission lines 20 and 30 (for example, Z=50Ω and Z2=10Ω). With this, as illustrated in FIG. 17, the layout of the transmission line parts structured in the directional coupler 4 becomes the same on the transmission side and the reception side. With the above structure, when a way of connecting the lines to the transmission line part is changed, the termination voltage, the terminal resistance, and so on, the differential method or the single end method in the directional coupler is easily interchangeable.

Referring to FIG. 17, the near end 21 and the far end 32 are connected, and the connection part 95 connecting the near end 21 and the far end 32 is terminated by a common terminal resistance 23, 33 so as to have the termination voltage $V_{T2}$.

The module 55 includes the transmission line 10, the terminal resistance 13, and a single end type single end circuit connected by the front end part 11. The transmission line 10 illustrated in FIG. 17 is the turnover line formed to bend in the U-like shape and includes the transmission line part 14 and the transmission line part 15.

The module 58 includes the transmission line 20, the transmission line 30, and the differential type differential circuit connected to the far end 22 of the transmission line 20 and the near end 31 of the transmission line 30. The transmission line on a side of the module 58 is formed to connect the near end 21 of the transmission line 20 and the far end 32 of the transmission line 30 and is the turnover line bent in the U-like shape.

The first U-like shaped transmission line is formed by connecting the transmission line part 14 and the transmission line part 15, and the second U-like shaped transmission line is formed by connecting the transmission line part 20 and the transmission line part 30. When the first U-like shaped transmission line and the second U-like shaped transmission line are viewed so as to project in a lamination direction of laminating the first U-like shaped transmission line and the second U-like shaped transmission line, the first U-like shaped transmission line and the second U-like shaped transmission line are arranged to face to be able to electromagnetically couple so that only one of the U-like shaped transmission lines is inverted upside down (in a manner similar to FIG. 20).

Structure of Embodiment 5

Figure 18:
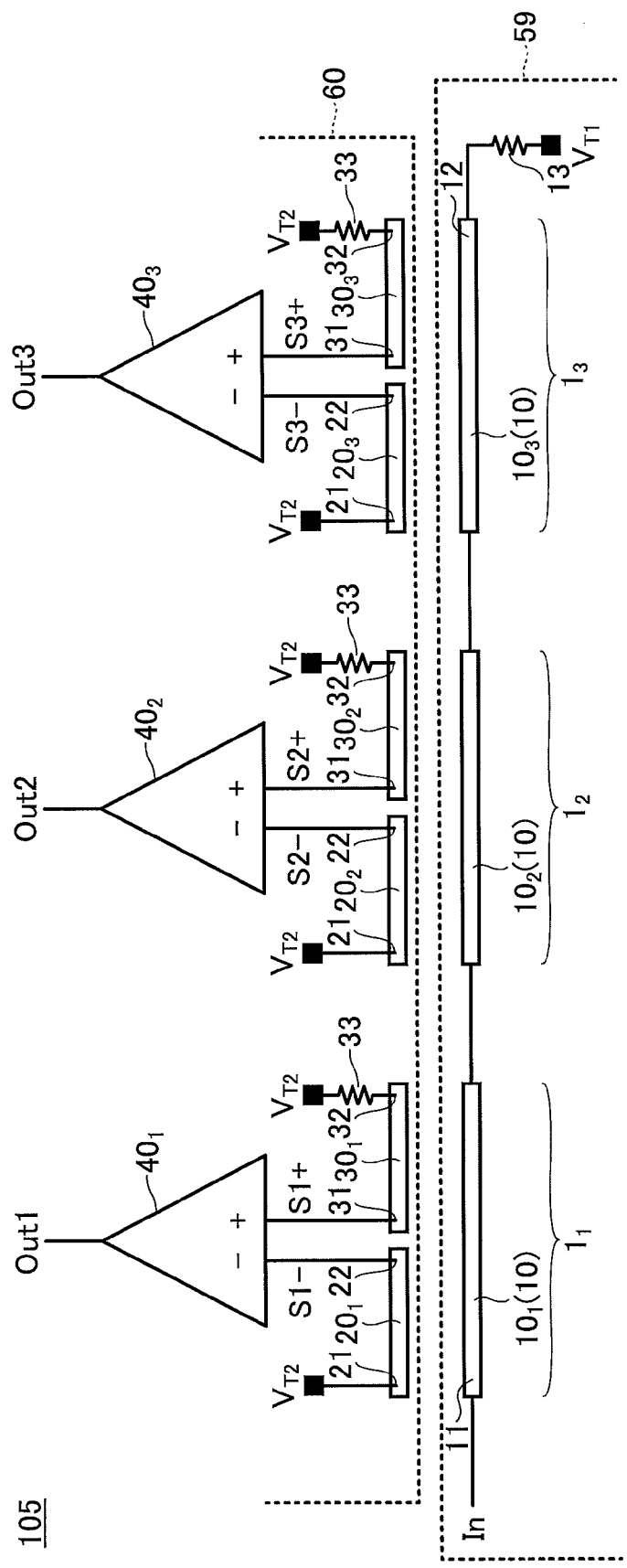
FIG. 18 illustrates an exemplary structure of the wireless device including the directional coupler.

FIG. 18 illustrates a structure of a communication device 105 including multiple directional couplers being the same as the directional coupler 1 illustrated in FIG. 1. The communication device 105 is a device for causing a module 59 and a module 60 to mutually communicate using the multiple directional couplers 1 without a contact between the module 59 and the module 60. The transmission line 10 has a structure of connecting a transmission line part $10_1$, a transmission line part $10_2$, and a transmission line part $10_3$ in series by a line. This structure exists between the front end part 11 and the terminal part 12. The first transmission line part $10_1$ is arranged to face a second transmission line $20_1$ and a third transmission line $30_1$ so as to be able to electromagnetically couple. The first transmission line part $10_2$ is arranged to face a second transmission line $20_2$ and a third transmission line $30_2$ so as to be able to electromagnetically couple. The first transmission line part $10_3$ is arranged to face a second transmission line $20_3$ and a third transmission line $30_3$ so as to be able to electromagnetically couple.

For example, the transmission line $20_1$ includes a near end 21 and a far end 22. The near end 21 is positioned on a side near the front end part 11 when tracing from the front end part 11 through the transmission line 10, and the far end 22 is positioned on a side far from the front end part 11 when tracing from the front end part 11 through the transmission line 10. For example, the transmission line $30_1$ includes a near end 31 and a far end 32. The near end 31 is positioned on a side near the front end part 11 when tracing from the front end part 11 through the transmission line 10, and the far end 32 is positioned on a side far from the front end part 11 when tracing from the front end part 11 through the transmission line 10. The other transmission lines $20_2$, $30_2$, $20_3$, and $30_3$ are arranged in a manner similar thereto.

A coupler $1_1$ is formed to arrange the transmission line part $10_1$ close to the transmission line $20_1$ and the transmission line $30_1$ so as to be able to electromagnetically couple the transmission line part $10_1$ with the transmission line $20_1$ and the transmission line $30_1$. The coupler $1_1$ is a directional coupler including the transmission line part $10_1$, the transmission line $20_1$, and the transmission line $30_1$. The other couplers $1_2$ and $1_3$ are formed in a manner similar thereto.

The communication device 105 having this structure functions as a multi-drop bus distributing one input digital signal In of the single end into multiple sets of differential signals (in this case, three sets of differential signals S1−/S1+, S2−/S2+, and S3−/S3+). The three sets of differential signals distributed by the couplers $1_1$, $1_2$, and $1_3$ are provided with a differential amplification by reception circuits $40_1$, $40_2$, and $40_3$ so as to be transformed to output signals Out1, Out2, and Out3 of the single end method, respectively.

The energy of the signal In input from the front end part 11 is sequentially distributed by the couplers $1_1$, $1_2$, and $1_3$ in a direction of propagating from the front end part 11 to the terminal part 12. Therefore, the energy of the signal reaching the coupler is greater as the distance of a route tracing the front end part 11 through the transmission line 10 is longer.

For example, provided that each degree of coupling of the three couplers $1_1$, $1_2$, and $1_3$ is "⅙", and the signal In whose signal energy is 1 is input from the front end part 11, an approximate rate of energy decrease of the energy of a signal Out1 output from the reception circuit 401 connected to the far end 22 and the near end 31 of the coupler $1_1$ relative to the energy of a signal In input into the front end part 11 is as follows.

$$1\times(1/6)=1/6 \text{ (about 0.17)}$$

An approximate rate of energy decrease of the energy of a signal Out2 output from the reception circuit $40_2$ connected to the far end 22 and the near end 31 of the coupler $1_2$ relative to the energy of a signal In input into the front end part 11 is as follows.

$$(1-(1/6))\times(1/6)=5/36 \text{ (about 0.14)}$$

An approximate rate of energy decrease of the energy of a signal Out3 output from the reception circuit $40_3$ connected to the far end 22 and the near end 31 of the coupler $1_3$ relative to the energy of a signal In input into the front end part 11 is as follows.

$$(1-(1/6)-(5/36))\times(1/6)=25/216 \text{ (about 0.12)}$$

As described above, when the degrees of coupling of the couplers are equal, the energies of the signals output from the reception circuits has a relationship of Out1>Out2>Out3. Said differently, as a position on a route tracing from the front end part 11 through the transmission line 10 has longer distance from the front end part 11, the attenuation of a signal reaching the coupler becomes more. Therefore, an error of a signal transmitted without a contact by a coupler far from the front end part 11 is apt to increase.

Therefore, it is preferable that the transmission line part $10_j$ among transmission line parts $10_n$ having a longer distance of tracing from the front end part 11 through the transmission line 10 couples stronger with a transmission line part $20_j$ arranged close to the transmission line part $10_j$ and a transmission line part $30_j$ arranged close to the transmission line part $10_j$. Here, "j" is a natural number. It is indicated that greater the value of "j", longer the distance of tracing from the front end part 11 through the transmission line 10 to the coupler. For example, it is preferable to set the degree of coupling of the coupler greater for the coupler whose distance of tracing from the front end part 11 through the transmission line 10 is longer.

For example, the degree $C_j$ of coupling of the couplers is set as follows.

$$C_1 \le C_2 \le \ldots \le C_N \text{ (in this regard, } C_1 < C_n)$$

By the above setting, if the position on a route tracing from the front end part 11 through the transmission line 10 has a long distance from the front end part 11, the attenuation of the signal reaching the coupler is prevented from increasing. Therefore, an error of a signal transmitted without a contact by a coupler far from the front end part 11 is not apt to increase.

For example, provided that degrees of coupling of the three couplers $1_1$, $1_2$, and $1_3$ are "⅙", "⅕", and "¼", respectively, and the signal In whose signal energy is 1 is input from the front end part 11, an approximate rate of energy decrease of the energy of a signal Out1 output from the reception circuit $40_1$ connected to the far end 22 and the near end 31 of the coupler $1_1$ relative to the energy of a signal In input into the front end part 11 is as follows.

$$1 \times (\frac{1}{6}) = \frac{1}{6}$$

An approximate rate of energy decrease of the energy of a signal Out2 output from the reception circuit $40_2$ connected to the far end 22 and the near end 31 of the coupler $1_2$ relative to the energy of a signal In input into the front end part 11 is as follows.

$$(1-(\frac{1}{6})) \times (\frac{1}{5}) = \frac{1}{6}$$

An approximate rate of energy decrease of the energy of a signal Out3 output from the reception circuit $40_3$ connected to the far end 22 and the near end 31 of the coupler $1_3$ relative to the energy of a signal In input into the front end part 11 is as follows.

$$(1-(\frac{1}{6})-(\frac{1}{6})) \times (\frac{1}{4}) = \frac{1}{6}$$

As described, when the degree of coupling is set greater for the coupler whose distance of tracing from the front end part 11 through the transmission line 10 is longer, the energies (for example, the signal amplitude) of the signals Out2 and Out3 are increased. Said differently, because it is possible to prevent the signal reaching the coupler apart from the front end part 11 from attenuating, the error of the signal transmitted without a contact by the coupler apart from the front end part 11 can be made small. Further, the energies of the signals output by the reception circuits are made equal by adjusting the degree $C_j$ of coupling to be an appropriate value (Out1=Out2=Out3).

The degree $C_j$ of coupling of the couplers may be adjusted in response to, for example, the distance between the transmission line $10_j$ and the transmission line $20_j$, the distance between the transmission line $10_j$ and the transmission line $30_j$, and the dimensions (the line length, the line width, or the like) of the transmission lines. For example, the degree $C_j$ of coupling becomes greater as the distance between the transmission line $10_j$ and the transmission line $20_j$ or the distance between the transmission line $10_j$ and the transmission line $30_j$ is shorter. Further, the degree $C_j$ of coupling of the couplers becomes greater as the line width of the transmission line is wider.

Here, it is indicated that coupling between the transmission line $10_j$ and the transmission line $20_j$ and coupling between the transmission line $10_j$ and the transmission line $30_j$ are stronger as the value of the degree $C_j$ of coupling is greater. The degree $C_j$ of coupling is a value determined in response to, for example, a ratio of the electric power of the signal Out output from the reception circuit $40_j$ relative to the electric power input into the end of the transmission line $10_j$ on a side of the front end part 11. Here, the gains of the reception circuit $40_j$ are mutually the same.

Further, it is preferable that the transmission lines $10_j$, $20_j$, and $30_j$ are structured so that the degree of coupling between the transmission line $10_j$ and the transmission line $20_j$ and the degree of coupling between the transmission line $10_j$ and the transmission line $30_j$ are equal. The degree of coupling between the transmission line $10_j$ and the transmission line $20_j$ is a value corresponding to, for example, a ratio of the electric power output from the far end 22 of the transmission line $20_j$ relative to the electric power input into the end of the transmission line $10_j$ on the side of the front end part 11. The degree of coupling between the transmission line $10_j$ and the transmission line $30_j$ is a value corresponding to, for example, a ratio of the electric power output from the near end 31 of the transmission line $30_j$ relative to the electric power input into the end of the transmission line $10_j$ on the side of the front end part 11.

The present invention includes a case where the module 59 and the module 60 are formed on the same circuit board. Further, referring to FIG. 18, the embodiment can be expanded to a multi-drop bus of distributing to two pairs or four or more pairs of differential signals. Furthermore, the directional couplers described in Embodiments 2-4 may be used to cause the multi-drop bus to function.

Structure of Embodiment 6

Figure 19:
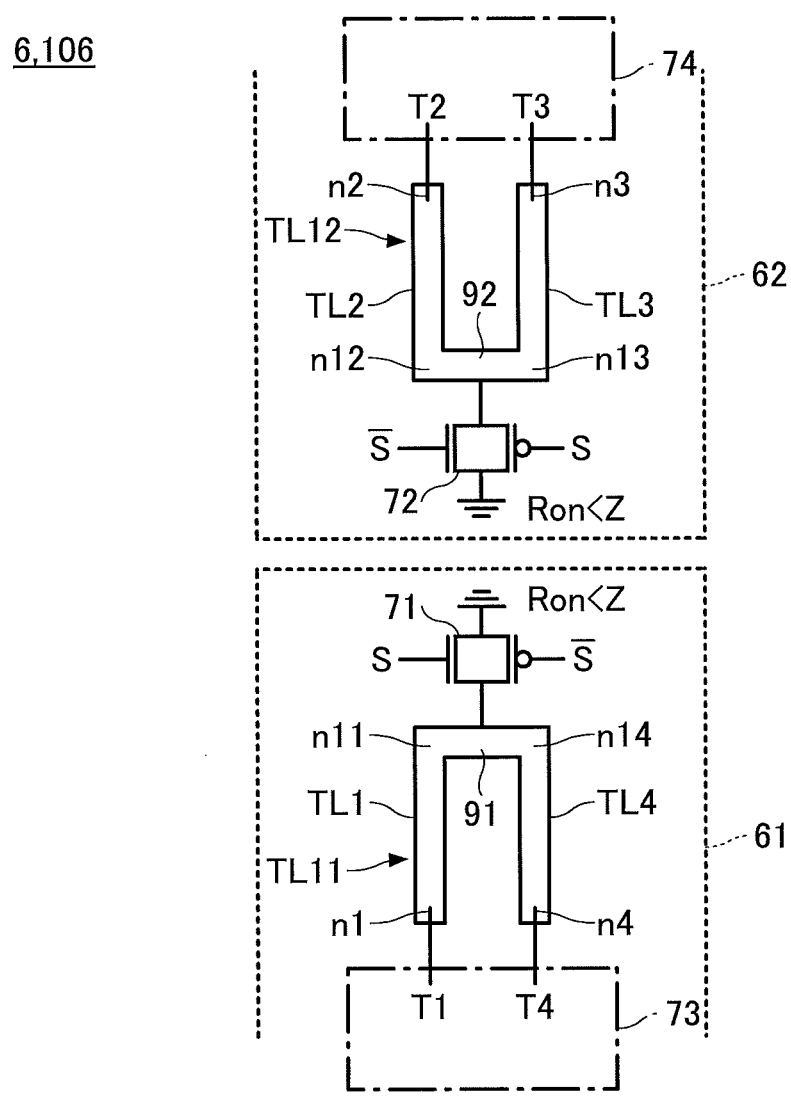
FIG. 19 illustrates an exemplary structure of the wireless device including the directional coupler.
Figure 20:
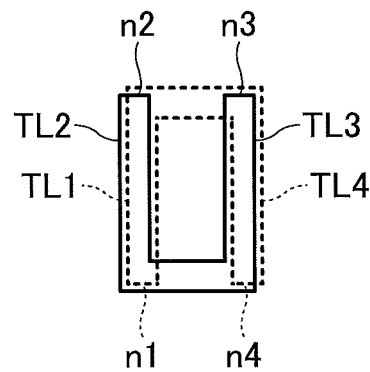
FIG. 20 illustrates an exemplary lamination arrangement of transmission lines.

FIG. 19 illustrates the structure of a communication device 106 including a directional coupler 6 in which the layout of the transmission line on a side of the module 58 illustrated in FIG. 17 is applied. The communication device 106 is a device for causing the module 61 and a module 62 to mutually communicate using the directional coupler 6 without a contact between the module 61 and the module 62. However, the module 61 and the module 62 are provided with a lamination arrangement in a direction perpendicular to the paper surface of FIG. 19 in a manner similar to FIGS. 12, 15, and 17 (see FIG. 20).

The directional coupler 6 includes a first transmission line TL11 and a second transmission line TL12. The first transmission line TL11 includes a transmission line part TL1 and a fourth transmission line part TL4. The second transmission line TL12 includes a second transmission line part TL2 electromagnetically coupling the first transmission line part TL1 and a third transmission line part TL3 electromagnetically coupling the fourth transmission line part TL4.

The transmission line part TL1 includes, for example, a near end n11 and a far end n1. The near end n11 is positioned on a side closer to the one end n2 when tracing the transmission line TL12 from one end n2 of the transmission line TL12. The far end n1 is positioned on a side farther from the one end n2 when tracing the transmission line TL12 from the one end n2 of the transmission line TL12.

The transmission line part TL4 includes, for example, a near end n4 and a far end n14. The near end n4 is positioned on a side closer to the one end n2 when tracing the transmission line TL12 from the one end n2 of the transmission line TL12. The far end n14 is positioned on a side farther from the one end n2 when tracing the transmission line TL12 from the one end n2 of the transmission line TL12.

The transmission line part TL2 includes, for example, a near end n12 and a far end n2. The near end n12 is positioned on a side closer to the one end n1 when tracing the transmission line TL11 from one end n1 of the transmission line TL11. The far end n2 is positioned on a side farther from the one end n1 when tracing the transmission line TL11 from the one end n1 of the transmission line TL11.

The transmission line part TL3 includes, for example, a near end n3 and a far end n13. The near end n3 is positioned on a side closer to the one end n1 when tracing the transmission line TL11 from one end n1 of the transmission line TL11. The far end n13 is positioned on a side farther from the one end n1 when tracing the transmission line TL11 from the one end n1 of the transmission line TL11.

The transmission line TL11 includes a first connection part 91, at which the near end n11 of the transmission line part TL1 and the far end n14 of the transmission line part TL4 are connected, and a second connection part 92, at which the near end n12 of the transmission line part TL2 and the far end n13 of the transmission line part TL3 are connected.

The directional coupler 6 includes a switch 71 formed in the module 61 and a switch 72 formed in the module 62.

The switch 71 is a switch circuit switching whether the connection part 91 is terminated to have a first impedance Ron smaller than the characteristic impedance of the transmission line part TL1 and/or the transmission line part TL4 in conformity with a logic level of a selection signal S or not. The switch 71 is structured to connect a N-channel MOS transistor and a P-channel MOS transistor in parallel. An on resistance obtained when both the N-channel MOS transistor and the P-channel MOS transistor turn on corresponds to the first impedance Ron.

The switch 72 is a switch circuit switching whether the connection part 92 is terminated to have a second impedance Ron smaller than the characteristic impedance of the transmission line part TL2 and/or the transmission line part TL3 in conformity with the logic level of the selection signal S or not. The switch 72 is structured to connect a N-channel MOS transistor and a P-channel MOS transistor in parallel. An on resistance obtained when both the N-channel MOS transistor and the P-channel MOS transistor turn on corresponds to the second impedance Ron.

The module 61 includes a transmission reception circuit 73 connected to the far end n1 of the transmission line part TL1 and the near end n4 of the transmission line part TL4. The module 62 includes a transmission reception circuit 74 connected to the far end n2 of the transmission line part TL2 and the near end n3 of the transmission line part TL3.

Figure 21:
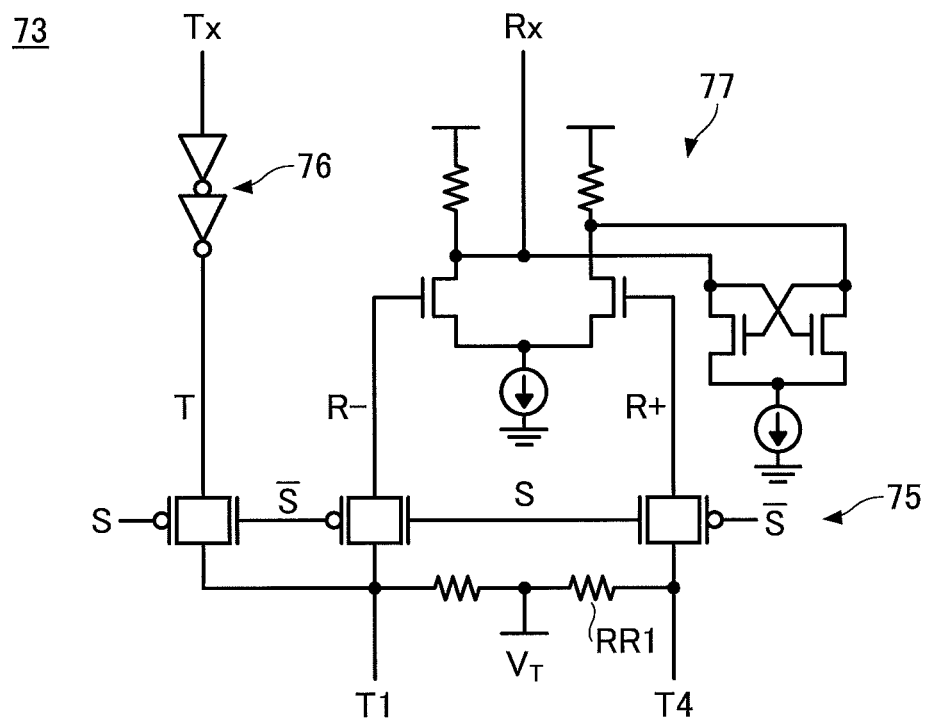
FIG. 21 illustrates an exemplary structure of a transmission reception circuit.

FIG. 21 illustrates a structure of the transmission reception circuit 73. The transmission reception circuit 73 includes a transmission circuit 76 capable of transmitting a single end signal, a reception circuit 77 capable of receiving a differential signal, and a transmission reception switch circuit 75. The transmission reception switch circuit 75 switches a connection destination of the far end n1 of the transmission line part TL1 to any one of the transmission circuit 76 and the reception circuit 77 in conformity with the logic level of the selection signal S, and switches a connection destination of the near end n4 of the transmission line part TL4 to any one of the terminal resistance RR1 and the reception circuit 77 in conformity with the logic level of the selection signal S.

Figure 22:
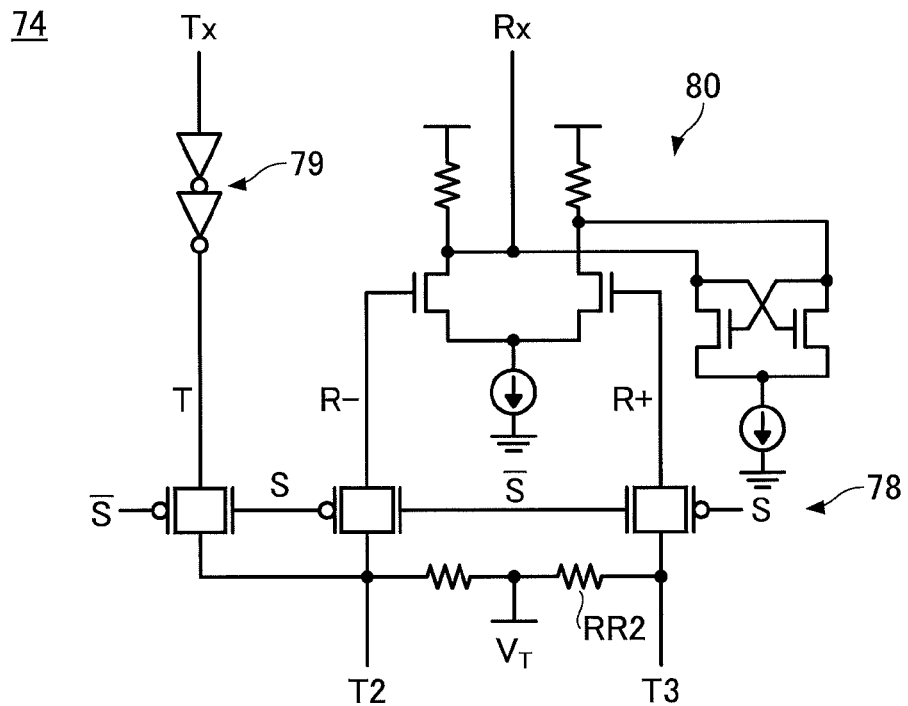
FIG. 22 illustrates an exemplary structure of the transmission reception circuit.

FIG. 22 illustrates a structure of the transmission reception circuit 74. The transmission reception circuit 74 includes a transmission circuit 79 capable of transmitting a single end signal, a reception circuit 80 capable of receiving a differential signal, and a transmission reception switch circuit 78. The transmission reception switch circuit 78 switches a connection destination of the far end n2 of the transmission line part TL2 to any one of the transmission circuit 79 and the reception circuit 80 in conformity with the logic level of the selection signal S, and switches a connection destination of the near end n3 of the transmission line part TL3 to any one of the terminal resistance RR2 and the reception circuit 80 in conformity with the logic level of the selection signal S.

When the selection signal S=0, the connection part 91 is not short circuited by the first impedance Ron by turning off the switch 71, and the connection part 92 is terminated by the second impedance Ron by turning on the switch 72. Further, when the selection signal S=0, the transmission reception switch circuit 78 switches a connection destination of the far end n2 of the transmission line part TL2 and switches a connection destination of the near end n3 of the transmission line part TL3 to the reception circuit 80. Further, when the selection signal S=0, the transmission reception switch circuit 75 switches a connection destination of the far end n1 of the transmission line part TL1 to the transmission circuit 76 and switches a connection destination of the near end n4 of the transmission line part TL4 to the transmission resistance RR.

Figure 23:
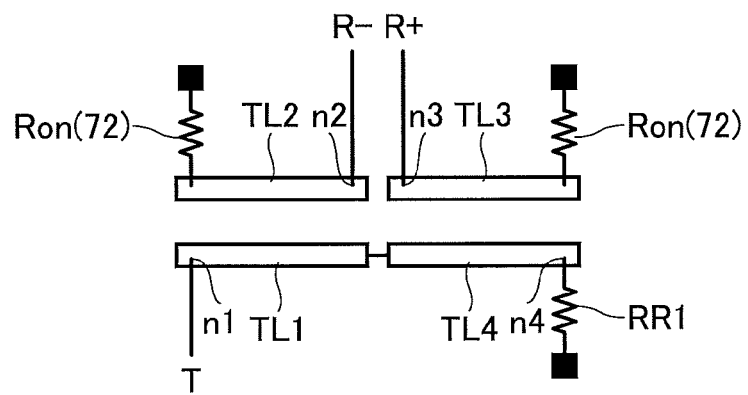
FIG. 23 illustrates a first transmission and reception structure of the directional coupler.

Said differently, when the selection signal S=0, the near end n4 of the transmission line part TL4 is provided with the matched termination using the terminal resistance RR1 so as to be switched to an operation mode where the signal is transferred from the transmission line parts TL1 and TL4 of the module 61 to the transmission line parts TL2 and TL3 of the module 62 (see FIG. 23).

When the selection signal S=1, the connection part 91 is not short circuited by the second impedance Ron by turning off the switch 72, and the connection part 91 is terminated by the first impedance Ron by turning on the switch 71. Further, when the selection signal S=1, the transmission reception switch circuit 75 switches a connection destination of the far end n1 of the transmission line part TL1 and the near end n4 of the transmission line part TL4 to the reception circuit 77. Further, when the selection signal S=1, the transmission reception switch circuit 78 switches a connection destination of the far end n2 of the transmission line part TL2 to the transmission circuit 79 and switches a connection destination of the near end n3 of the transmission line part TL3 to the transmission resistance RR.

Figure 24:
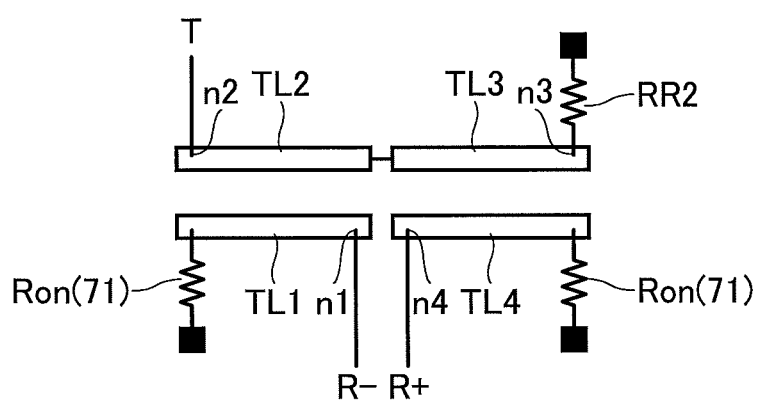
FIG. 24 illustrates a second transmission and reception structure of the directional coupler.

Said differently, when the selection signal S=1, the near end n3 of the transmission line part TL3 is provided with the matched termination using the terminal resistance RR2 so as to be switched to an operation mode where the signal is transferred from the transmission line parts TL2 and TL3 of the module 62 to the transmission line parts TL1 and TL4 of the module 61 (see FIG. 24).

Structure of Embodiment 7

Figure 25:
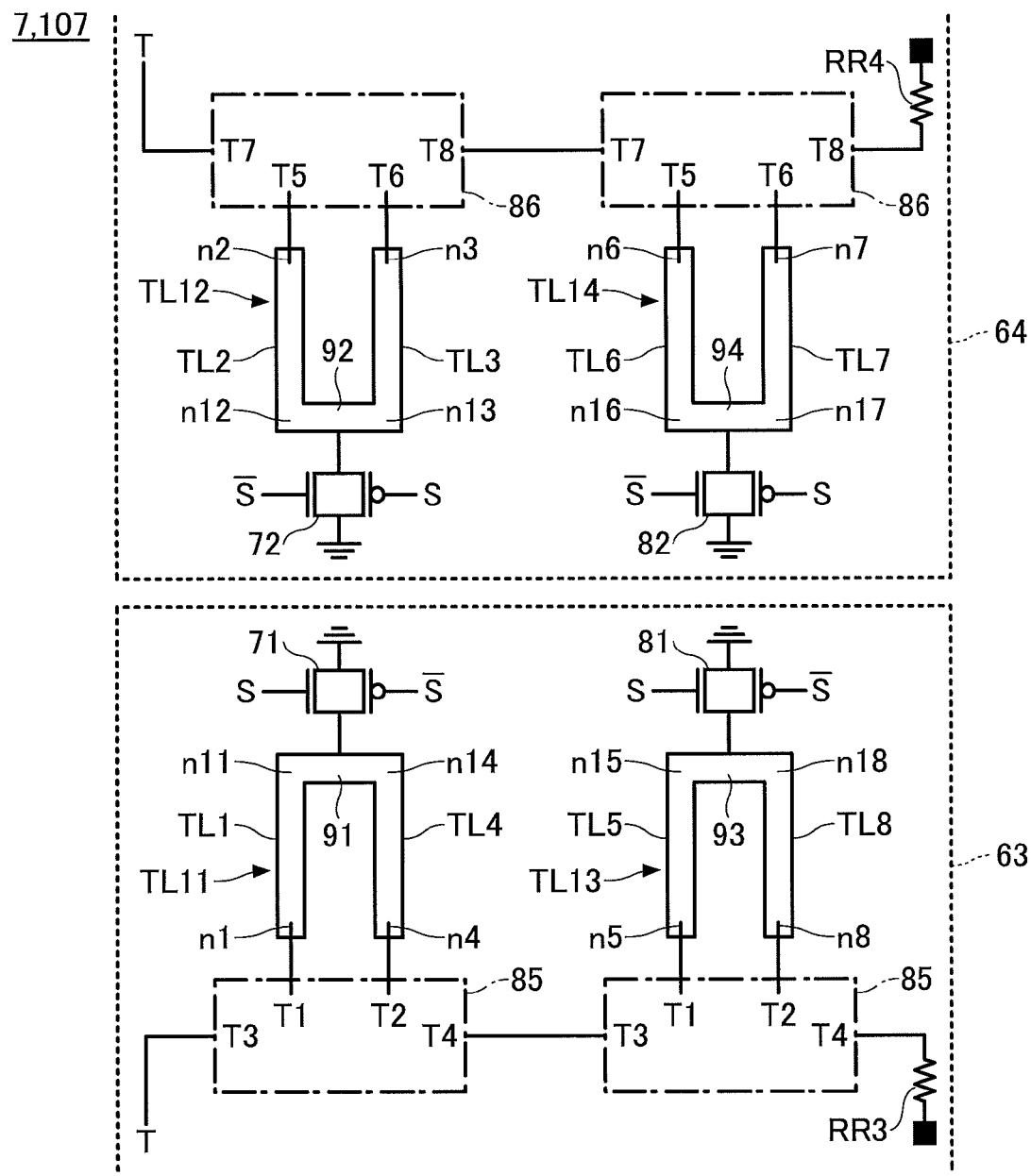
FIG. 25 illustrates an exemplary structure of the wireless device including the directional coupler.

FIG. 25 illustrates the structure of a communication device 107 including a directional coupler 7 in which the layout of the transmission line on a side of the module 58 illustrated in FIG. 17. The communication device 107 is a device for causing the module 63 and a module 64 to mutually communicate using the directional coupler 7 without a contact between the module 63 and the module 64. In the communication device 107, the module 63 and the module 64 are provided with a lamination arrangement in a direction perpendicular to the paper surface of FIG. 25 in a manner similar to FIGS. 12, 15, and 17 (see FIG. 20). Description of a structure similar to the above-described structure is omitted or simplified.

The directional coupler 7 includes a first transmission line TL11, a second transmission line TL12, a third transmission line TL13, and a fourth transmission line TL14. The first transmission line TL13 includes a fifth transmission line part TL5 and an eighth transmission line part TL8. The fourth transmission line TL14 includes a sixth transmission line part TL6 electromagnetically coupling the fifth transmission line part TL5 and a seventh transmission line part TL7 electromagnetically coupling the eighth transmission line part TL8.

The transmission line part TL5 includes, for example, a near end n15 and a far end n5. The near end n15 is positioned on a side closer to one end n6 of the transmission line TL14 when tracing the transmission line TL14 from the one end n6 of the transmission line TL14. The far end n5 is positioned on a side farther from the one end n6 of the transmission line TL14 when tracing the transmission line TL14 from the one end n6 of the transmission line TL14.

The transmission line part TL8 includes, for example, a near end n8 and a far end n18. The near end n8 is positioned on a side closer to one end n6 of the transmission line TL14 when tracing the transmission line TL14 from the one end n6 of the transmission line TL14. The far end n18 is positioned on a side farther from the one end n6 of the transmission line TL14 when tracing the transmission line TL14 from the one end n6 of the transmission line TL14.

The transmission line part TL6 includes, for example, a near end n16 and a far end n6. The near end n16 is positioned on a side closer to one end n5 of the transmission line TL13 when tracing the transmission line TL13 from the one end n5 of the transmission line TL13. The far end n6 is positioned on a side farther from the one end n5 of the transmission line TL13 when tracing the transmission line TL13 from the one end n5 of the transmission line TL13.

The transmission line part TL7 includes, for example, a near end n7 and a far end n17. The near end n7 is positioned on a side closer to one end n5 of the transmission line TL13 when tracing the transmission line TL13 from the one end n5 of the transmission line TL13. The far end n17 is positioned on a side farther from the one end n5 of the transmission line TL13 when tracing the transmission line TL13 from the one end n5 of the transmission line TL13.

The transmission line TL13 includes a third connection part 93, at which the near end n15 of the transmission line part TL5 and the far end n18 of the transmission line part TL8 are connected, and a fourth connection part 94, at which the near end n16 of the transmission line part TL6 and the far end n17 of the transmission line part TL7 are connected.

The directional coupler 7 includes switches 71 and 81 formed in the module 63 and switches 72 and 82 formed in the module 64.

The switch 81 is a switch circuit switching whether the connection part 93 is terminated to have a third impedance Ron smaller than the characteristic impedance of the transmission line part TL5 and/or the transmission line part TL8 in conformity with the logic level of the selection signal S or not. The switch 81 is structured to connect a N-channel MOS transistor and a P-channel MOS transistor in parallel. An on resistance obtained when both the N-channel MOS transistor and the P-channel MOS transistor turn on corresponds to the third impedance Ron.

The switch 82 is a switch circuit switching whether the connection part 94 is terminated to have a fourth impedance Ron smaller than the characteristic impedance of the transmission line part TL6 and/or the transmission line part TL7 in conformity with the logic level of the selection signal S or not. The switch 82 is structured to connect a N-channel MOS transistor and a P-channel MOS transistor in parallel. An on resistance obtained when both the N-channel MOS transistor and the P-channel MOS transistor turn on corresponds to the fourth impedance Ron.

The module 63 includes a transmission reception circuit 85 connected to the far ends n1 and n5 of the transmission line parts TL1 and TL5 and the near ends n4 and n8 of the transmission line parts TL4 and TL8. The module 64 includes a transmission reception circuit 86 connected to the far ends n2 and n6 of the transmission line parts TL2 and TL6 and the near ends n3 and n7 of the transmission line parts TL3 and TL7.

Figure 26:
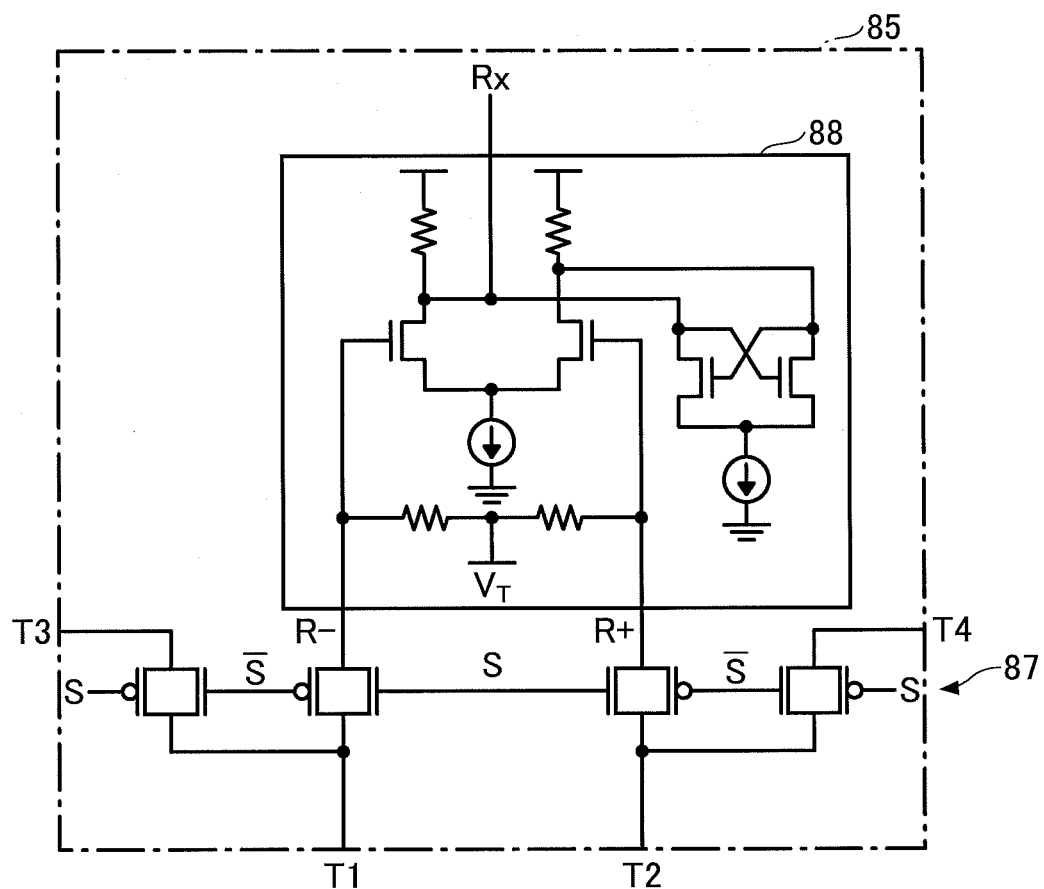
FIG. 26 illustrates an exemplary structure of the transmission reception circuit.

FIG. 26 illustrates a structure of the transmission reception circuit 85. The transmission reception circuit 85 includes transmission circuits T capable of transmitting a single end signal, a reception circuit 88 capable of receiving a differential signal, and a transmission reception switch circuit 87. The transmission reception switch circuit 87 switches a connection destination of far ends n1 and n5 of the transmission line parts TL1 and TL5 to any one of the transmission circuit T and the reception circuit 88 in conformity with the logic level of the selection signal S, and switches a connection destination of near ends n4 and n8 of the transmission line parts TL4 and TL8 to any one of a terminal resistance RR3 and the reception circuit 88 in conformity with the logic level of the selection signal S, respectively.

Figure 27:
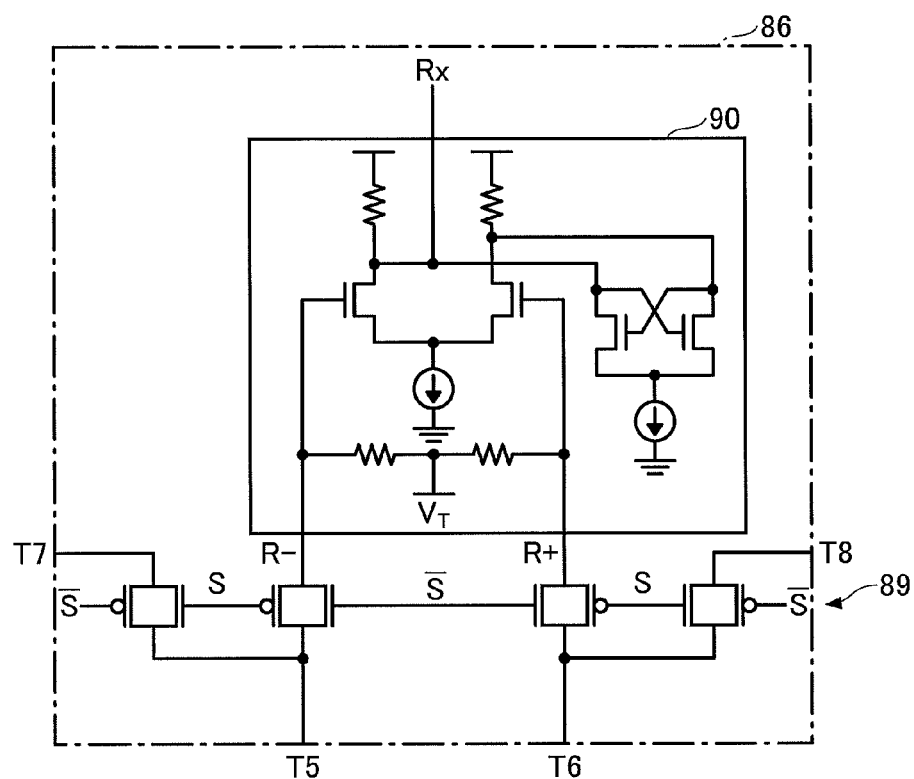
FIG. 27 illustrates an exemplary structure of the transmission reception circuit.
Figure 28:
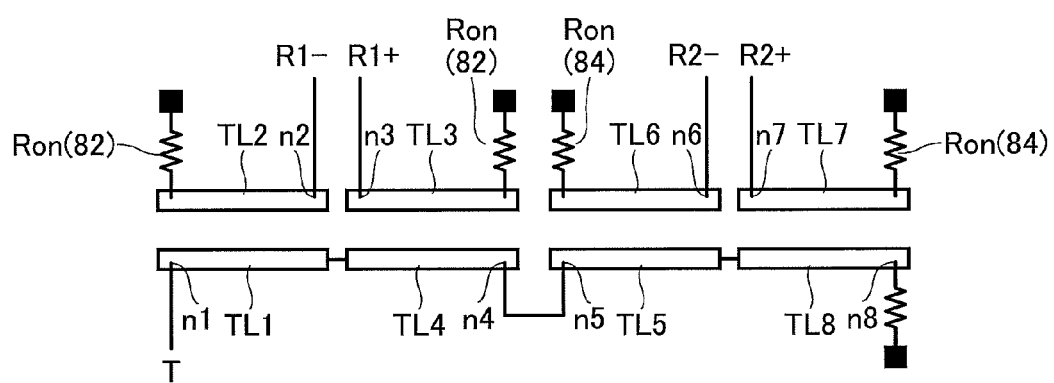
FIG. 28 illustrates a first transmission and reception structure of a multi-drop bus.
Figure 29:
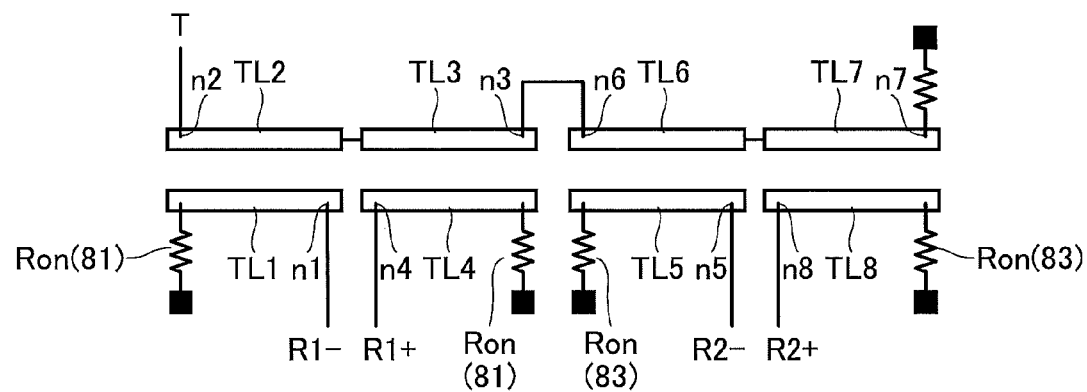
FIG. 29 illustrates a second transmission and reception structure of the multi-drop bus.

FIG. 27 illustrates a structure of the transmission reception circuit 86. The transmission reception circuit 86 includes transmission circuits T capable of transmitting a single end signal, a reception circuit 90 capable of receiving a differential signal, and a transmission reception switch circuit 89. The transmission reception switch circuit 89 switches a connection destination of far ends n2 and n6 of the transmission line parts TL2 and TL6 to any one of the transmission circuit T and the reception circuit 90 in conformity with the logic level of the selection signal S, and switches a connection destination of near ends n3 and n7 of the transmission line parts TL3 and TL7 to any one of a terminal resistance RR4 and the reception circuit 90 in conformity with the logic level of the selection signal S, respectively.

When the selection signal S=0, the connection parts 91 and 93 are not short circuited by the first and third impedances Ron by turning off the switches 71 and 81, and the connection parts 92 and 94 are terminated by the second and fourth impedances Ron by turning on the switches 72 and 82, respectively. Further, when the selection signal S=0, the transmission reception switch circuit 89 switches a connection destination of the far ends n2 and n6 of the transmission line parts TL2 and TL6 and switches a connection destination of the near ends n3 and n7 of the transmission line parts TL3 and TL7 to the reception circuit 90, respectively. Further, when the selection signal S=0, the transmission reception switch circuit 87 switches a connection destination of the far ends n1 and n5 of the transmission line parts TL1 and TL5 to the transmission circuit T and switches a connection destination of the near ends n4 and n8 of the transmission line parts TL4 and TL8 to the transmission resistance RR3.

Said differently, when the selection signal S=0, the near end n4 of the transmission line part TL4 is provided with the matched termination using the terminal resistance RR3 through the transmission line part TL5 and the transmission line part TL8. Then, the directional coupler is switched to a multi-drop bus operation mode where the signal is transferred from the transmission line parts TL1, T14, T15, and T18 of the module 63 to the transmission line parts TL2, Tl3, Tl6, and Tl7 of the module 64 (see FIG. 28).

When the selection signal S=1, the connection parts 92 and 94 are not short circuited by the second and fourth impedances Ron by turning off the switches 72 and 82, and the connection parts 91 and 93 are terminated by the first and third impedances Ron by turning on the switches 71 and 81, respectively. Further, when the selection signal S=1, the transmission reception switch circuit 87 switches a connection destination of the far ends n1 and n5 of the transmission line parts TL1 and TL5 and switches a connection destination of the near ends n4 and n8 of the transmission line parts TL4 and TL8 to the reception circuit 88, respectively. Further, when the selection signal S=1, the transmission reception switch circuit 89 switches a connection destination of the far ends n2 and n6 of the transmission line parts TL2 and TL6 to the transmission circuit T and switches a connection destination of the near ends n3 and n7 of the transmission line parts TL3 and TL7 to a transmission resistance RR4, respectively.

Said differently, when the selection signal S=1, the near end n3 of the transmission line part TL3 is provided with the matched termination using the terminal resistance RR4 through the transmission line part TL6 and the transmission line part TL7. Then, the directional coupler is switched to the multi-drop bus operation mode where the signal is transferred from the transmission line parts TL2, Tl3, Tl6, and Tl7 of the module 64 to the transmission line parts TL1, Tl4, Tl5, and Tl8 of the module 63 (see FIG. 29).

Structure of Embodiment 8

Figure 30:
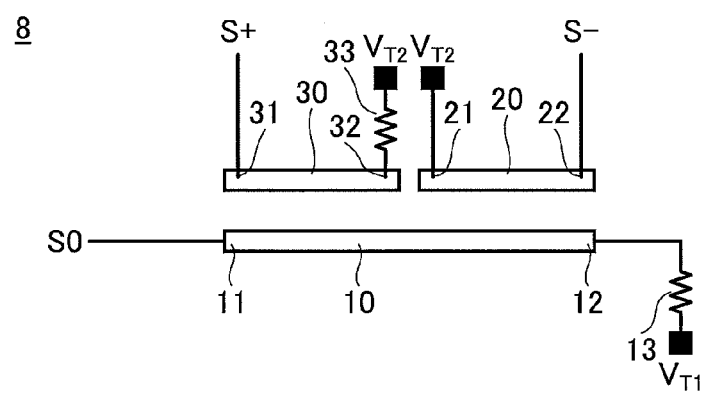
FIG. 30 illustrates an exemplary structure of the transmission reception circuit.
Figure 31:
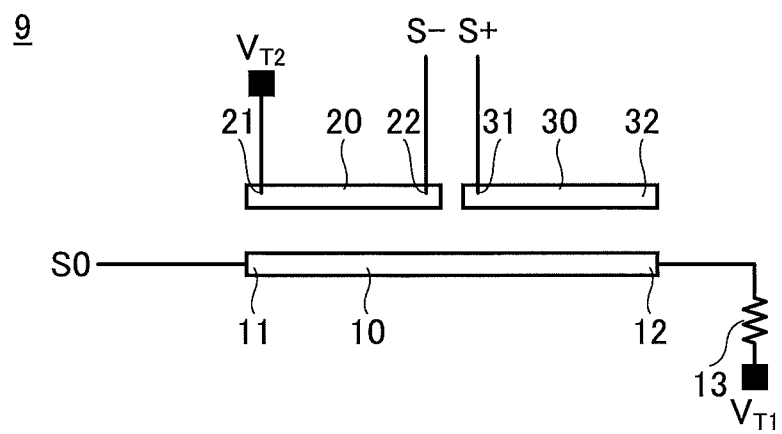
FIG. 31 illustrates an exemplary structure of the directional coupler.

FIG. 30 illustrates a structure of a directional coupler 8. Referring to FIG. 30, adverse to the structure illustrated in FIG. 1, the transmission line 20 may be arranged to face the transmission line 10 so that the transmission line 20 is positioned farther than the transmission line 30 from the front end part 11. In a case of the directional coupler 8, an output of a negative polarity signal delays an output of a positive polarity signal by a time while the input signal S0 propagates a center portion of the transmission line 10. However, the directional coupler 8 sufficiently functions as a 180-degree phase shifter.

In this case, a distance from the front end part 11 through the transmission line 10 to a portion of the transmission line 10 closest to the far end 22 is longer than a distance from the front end part 11 through the transmission line 10 to a portion of the transmission line 10 closest to the near end 21. The "portion closest to the far end 22" is a portion of the transmission line 10, for example, the terminal part 12. The "portion closest to the near end 21" is a portion of the transmission line 10, for example, a center portion (a center portion of the transmission line 10) between the front end part 11 and the terminal part 12. In a manner similar thereto, a distance from the front end part 11 through the transmission line 10 to a portion closest to the far end 32 is longer than a distance from the front end part 11 through the transmission line 10 to a portion closest to the near end 31. The "portion closest to the far end 32" is a portion of the transmission line 10, for example, a center portion (a center portion of the transmission line 10) between the front end part 11 and the terminal part 12. The "portion closest to the near end 31" is a portion of the transmission line 10, for example, the front end part 11.

A minute gap exists between the far end 32 of the transmission line 30 and the near end 21 of the transmission line 20. However, it is preferable to arrange the transmission line 20 and the transmission line 30 so that the gap is not excessively great. When the gap is a predetermined minute value or smaller, the phase difference between the signal S− output from the far end 22 and the signal S+ output from the near end 31 may be easily caused to approach 180°.

Further, it is preferable to arrange the transmission line 20 and the transmission line 30 so that the transmission line 20 does not overlap the transmission line 30 in a facing direction where the transmission line 10 faces the transmission lines 20 and 30. Because the transmission line 20 does not overlap the transmission line 30, it is possible to prevent a degree of coupling between the transmission line 10 and the transmission line 20 or a degree of coupling between the transmission line 10 and the transmission line 30 from decreasing.

Structure of Embodiment 9

In the directional coupler 1 illustrated in FIG. 1, even though the far end 32 of the transmission line 30 is not provided with the matched termination, a great reflection interruption is not caused. Especially, in a case where a signal propagating from the transmission line 10 to the near end 31 of the transmission line 30 is great and a signal propagating from the transmission line 10 to the far end 32 of the transmission line 30 is small (a directionality strongly appears), even if the far end 32 is not provided with the matched termination to reflect the signal, an influence of the signal reflection is too small to cause the interruption. Therefore, the impedance Z3 of the terminal resistance 33 may be different from the characteristic impedance Z of the transmission line 30. For example, the impedance Z3 of the terminal resistance 33 may be greater than the characteristic impedance Z of the transmission line 30. Specifically, the following relationship may be set: Z=50Ω and Z3=75Ω. For example, the far end 32 may be provided with the open circuit termination (Z3=∞Ω) like the directional coupler 9 illustrated in FIG. 31. In this case, there is an advantage that a line to the terminal resistance or to the termination voltage is unnecessitated.

<Matched Termination of Terminal Part of First Transmission Line 10>

Figure 32:
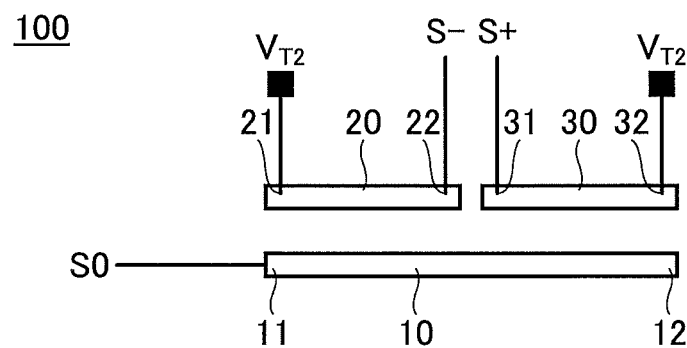
FIG. 32 illustrates a structure of a coupler (a comparative example).

Described next is a difference between a case where the terminal part 12 of the transmission line 10 on the side of the single end is provided with the matched termination (Embodiment 1 of the present invention: the directional coupler 1 illustrated in FIG. 1) and a case where the terminal part 12 is opened (Comparative Example: a coupler 100 illustrated in FIG. 32). FIG. 32 illustrates a structure of the coupler 100 (Comparative Example) in which the terminal part 12 is not provided with the matched termination but opened. The coupler 100 is called "Marchand Balun".

Figure 33:
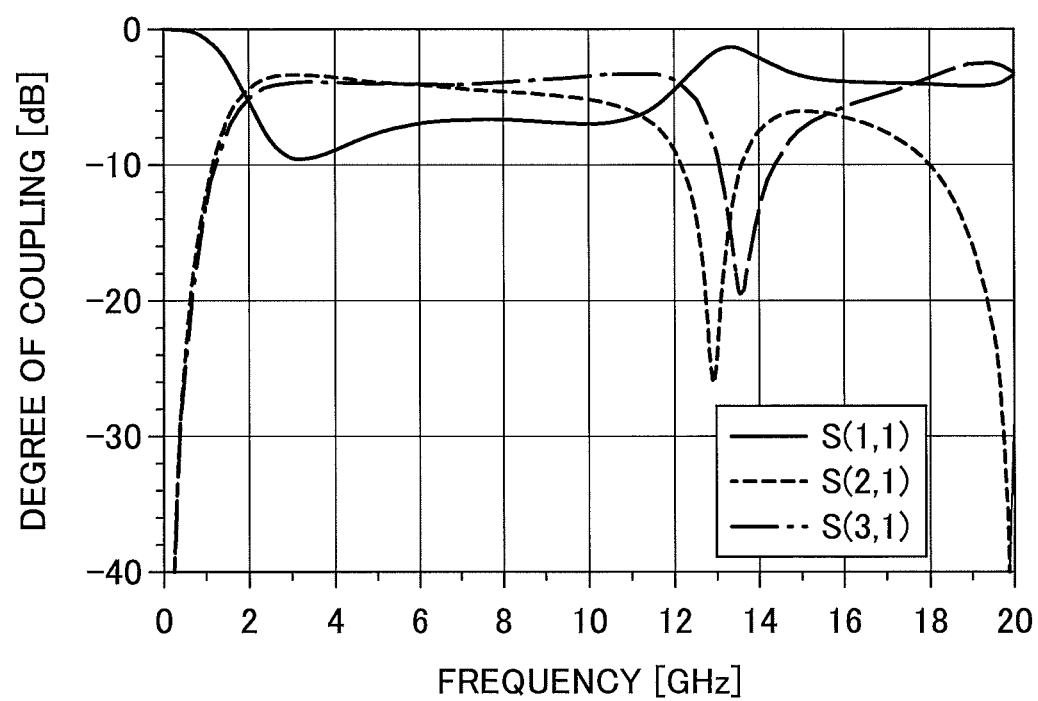
FIG. 33 is a graph indicating a simulation result of the coupler (the comparative example).

FIG. 33 illustrates a simulation result (an S parameter) of the degree of coupling in the directional coupler 100. As clearly known by a comparison between FIG. 9 (the directional coupler 1) and FIG. 33 (the coupler 100), FIG. 9 is excellent at a point that the degree of coupling is constant in a wide frequency range. Especially, a difference exists at around 13 GHz.

Figure 34:
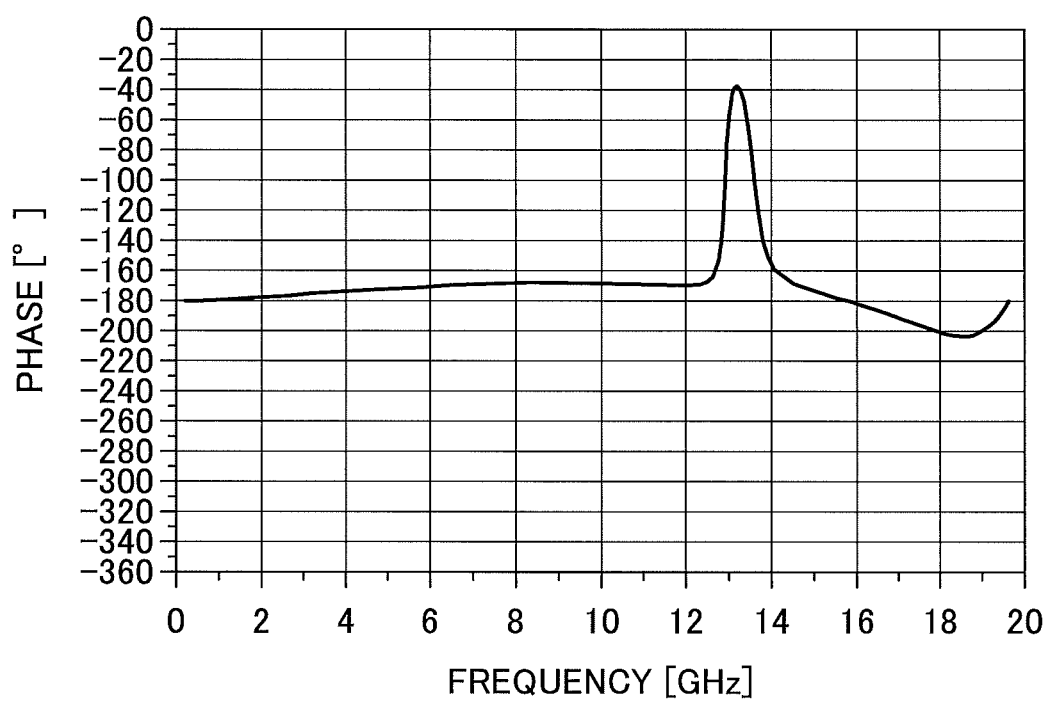
FIG. 34 is a graph indicating a simulation result of the coupler (the comparative example).

FIG. 34 illustrates a simulation result of a phase difference of the differential signal output from the directional coupler 100. As clearly known by a comparison between FIG. 10 (the directional coupler 1) and FIG. 34 (the coupler 100), FIG. 10 is excellent at a point that a phase shift around 180 degree is possible in a wide frequency range. Especially, a difference exists at around 13 GHz.

Figure 35:
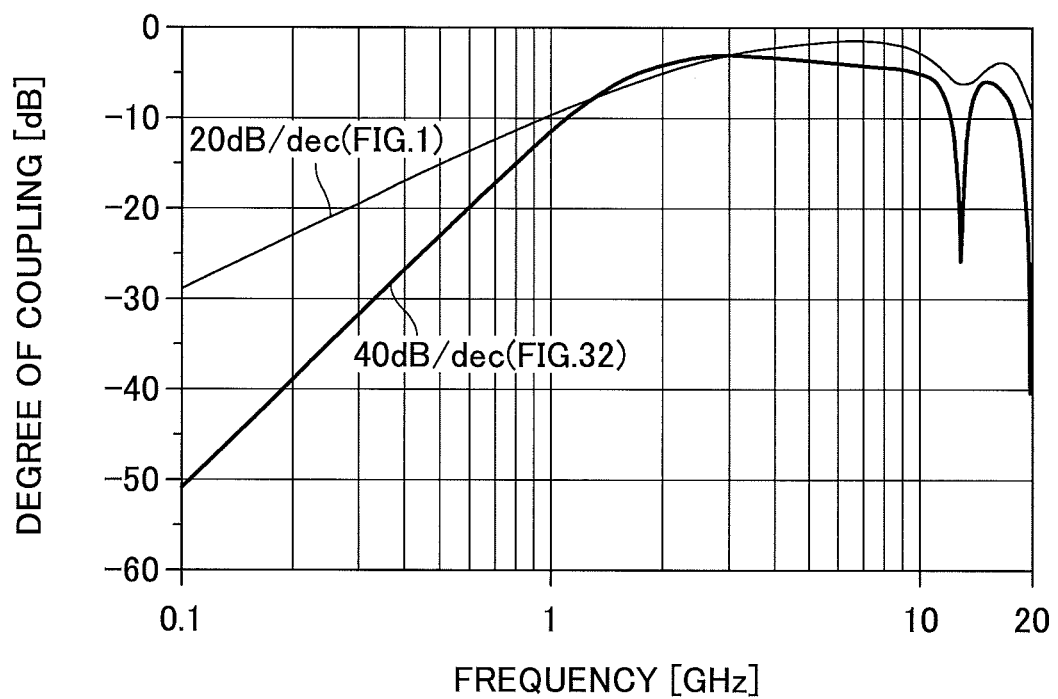
FIG. 35 is a graph indicating a degree of coupling between the directional coupler (the embodiment) and the coupler (the comparative example).
Figure 36:
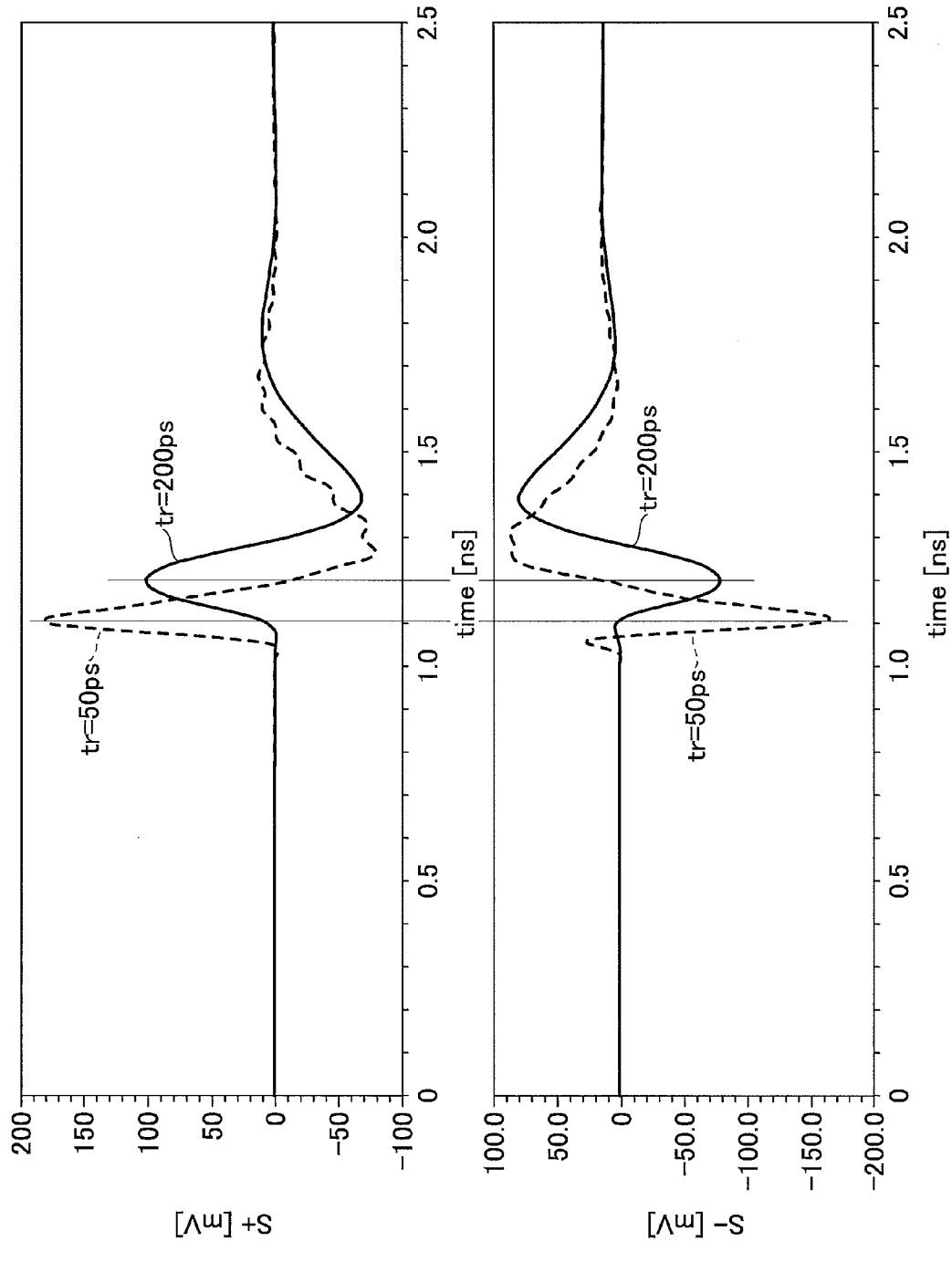
FIG. 36 is a graph indicating a simulation result of the coupler (the comparative example).

FIG. 35 is an enlarged graph of the degree of coupling in a low frequency range of FIG. 9 (the directional coupler 1) and FIG. 33 (the coupler 100). Referring to FIG. 35, the directional coupler 1 attenuates 20 dB/dec in the low frequency range. Therefore, the input signal is provided with a first-order differentiation. An input digital signal is output as a pulse waveform. Therefore, the reception circuit easily recovers the digital signal and the structure of the reception circuit is simplified.

Meanwhile, the coupler 100 attenuates 40 dB/dec in the low frequency range. Therefore, the input signal is provided with a second-order differentiation. An input digital signal is output as a bipolar pulse waveform (see FIG. 36). Therefore, the reception circuit does not easily recover the digital signal and the structure of the reception circuit becomes complicated.

Said differently, the directional coupler 1 effectively functions as a 180-degree phase shifter for a digital signal having a large amplitude and a wide frequency range. However, it is difficult to cause the coupler 100 to effectively function as such a 180-degree phase shifter for a digital signal.

The embodiments of the directional coupler and the communication device are described above. However, the present invention is not limited to the above embodiments. Within a scope of the present invention, various modifications and alternations such as a combination and a substitution of a part or all of the other embodiment are possible.

For example, the shape of the letter "U" of the transmission line may include a meaning of a letter "V". An opening angle of the letter "U" may be arbitrarily determined.

This international application is based on and claims priority to Japanese Patent Application No. 2013-169471 filed on Aug. 19, 2013, the entire contents of Japanese Patent Application No. 2013-169471 are hereby incorporated herein by reference.

EXPLANATION OF REFERENCE SIGNS 1,3,4,6,7,8,9: directional coupler
1a,1b,1c: coupler
10,20,30,$20_1$,$30_1$,$20_2$,$30_2$,$20_3$,$30_3$: transmission line
$10_1$,$10_2$,$10_3$,14,15: transmission line part
11: front end part
12: terminal part
13,23,33,33a,33b,33c: terminal resistance
16: transmission circuit
17: transmission circuit
21,31,21a,31a,21b,31b,21c,31c: near end
22,32,22a,32a,22b,32b,22c,32c: far end
40,40a,40b,40c: reception circuit
41,43: comparison circuit
42,44: signal hold circuit
45: reception circuit
46: predriver
47: 50 ohm driver
48: inductance
49,50: capacitance
51,52,53,54,55,56,57,58,59,60,61,62,63,64: module
71,72,81,82: switch
73,74,85,86: transmission reception circuit
76,79: transmission circuit
77,80,88,90: reception circuit
75,78,87,89: transmission reception switch circuit
91,92,93,94,95: connection part
100: coupler
101A,101B,101C,103,104,105,106,107: communication device

The invention claimed is:

1. A directional coupler comprising:
a first transmission line including
a terminal part provided with a matched termination, and
a front end part which is an end portion on a side opposite to a side of the terminal part;
a second transmission line electromagnetically coupled with the first transmission line; and
a third transmission line electromagnetically coupled with the first transmission line,
wherein each of the second transmission line and the third transmission line includes a near end and a far end, the near end being positioned on a side closer to the front end part when tracing the first transmission line from the front end part, the far end being positioned on a side farther from the front end part when tracing the first transmission line from the front end part, and
wherein the near end of the second transmission line is terminated to have an impedance smaller than a characteristic impedance of the second transmission line.

2. The directional coupler according to claim 1,
wherein the far end of the second transmission line outputs a signal of a negative polarity upon an input of a signal input into the front end part, and
wherein the near end of the third transmission line outputs a signal of a positive polarity upon the input of the signal input into the front end part.

3. The directional coupler according to claim 1,
wherein the second transmission line is positioned closer to the front end part than the third transmission line.

4. The directional coupler according to claim 1,
wherein the second transmission line is positioned farther from the front end part than the third transmission line.

5. The directional coupler according to claim 1,
wherein the near end of the second transmission line is provided with a short circuit termination.

6. The directional coupler according to claim 1,
wherein the far end of the third transmission line is provided with a matched termination.

7. The directional coupler according to claim 1,
wherein the far end of the third transmission line is terminated to have an impedance smaller than a characteristic impedance of the third transmission line.

8. The directional coupler according to claim 7,
wherein the far end of the third transmission line is provided with a short circuit termination.

9. The directional coupler according to claim 8,
wherein a connection part between the near end of the second transmission line and the far end of the third transmission line is provided with a short circuit termination.

10. The directional coupler according to claim 9,
wherein a transmission line of a U-like shape is formed by the second transmission line and the third transmission line.

11. The directional coupler according to claim 7,
wherein a connection part between the near end of the second transmission line and the far end of the third transmission line is terminated to have an impedance smaller than a characteristic impedance of the second transmission line or the third transmission line.

12. The directional coupler according to claim 1,
wherein the far end of the third transmission line is terminated to have an impedance greater than a characteristic impedance of the second transmission line.

13. The directional coupler according to claim 12,
wherein the far end of the third transmission line is provided with an open circuit termination.

14. The directional coupler according to claim 1,
wherein the second transmission line or the third transmission line has a characteristic impedance equal to a characteristic impedance of the first transmission line.

15. The directional coupler according to claim 1,
wherein the second transmission line or the third transmission line has a characteristic impedance different from a characteristic impedance of the first transmission line.

16. The directional coupler according to claim 1,
wherein the first transmission line includes a plurality of transmission line parts between the front end part and the terminal part, and wherein the plurality of transmission line parts couples the second transmission line and the third transmission line.

17. The directional coupler according to claim 16, wherein the transmission line part among the plurality of transmission line parts having a longer distance of tracing the first transmission line from the front end part is connected stronger to the second transmission line and the third transmission line.

18. A communication device comprising:
the directional coupler according to claim 1,
a single end circuit connected to the front end part, and
a differential circuit connected to the far end of the second transmission line and the near end of the third transmission line.

19. A directional coupler comprising:
a first transmission line including
   a first transmission line part, and
   a fourth transmission line part;
a second transmission line including
   a second transmission line part electromagnetically coupled with the first transmission line part, and
   a third transmission line part electromagnetically coupled with the fourth transmission line part; and
a switch circuit,
wherein each of the first transmission line part and the fourth transmission line part includes a near end and a far end, the near end being positioned on a side closer to an end of the second transmission line when tracing the second transmission line from the end of the second transmission line, the far end being positioned on a side farther from the end when tracing the second transmission line from the end the second transmission line,
wherein each of the second transmission line part and the third transmission line part includes a near end and a far end, the near end being positioned on a side closer to an end of the first transmission line when tracing the first transmission line from the end, the far end being positioned on a side farther from the end of the first transmission line when tracing the first transmission line from the end,
wherein the first transmission line includes a first connection part where the near end of the first transmission line part is connected with the far end of the fourth transmission line part,
wherein the second transmission line includes a second connection part where the near end of the second transmission line part is connected with the far end of the third transmission line part,
wherein the switch circuit switches the near end of the third transmission line part to provide a matched termination when the first connection part terminates to have a first impedance smaller than a characteristic impedance of the first transmission line part or the fourth transmission line part in a case where the second connection part is not short-circuited, and
wherein the switch circuit switches the near end of the fourth transmission line part to provide the matched termination when the second connection part terminates to have a second impedance smaller than a characteristic impedance of the second transmission line part or the third transmission line part in a case where the first connection part is not short-circuited.

20. A communication device comprising:
the directional coupler according to claim 19;
a first single end circuit connected to the far end of the second transmission line part when the near end of the third transmission line part is switched to provide the matched termination;
a first differential circuit connected to the far end of the first transmission line part and the near end of the fourth transmission line part when the near end of the third transmission line part is switched to provide the matched termination;
a second single end circuit connected to the far end of the first transmission line part when the near end of the fourth transmission line part is switched to provide the matched termination; and
a second differential circuit connected to the far end of the second transmission line part and the near end of the third transmission line part when the near end of the fourth transmission line part is switched to provide the matched termination.

21. The directional coupler according to claim 19, the directional coupler further comprising:
a third transmission line including
   a fifth transmission line part, and
   an eighth transmission line part; and
a fourth transmission line including
   a sixth transmission line part electromagnetically coupled with the fifth transmission line part, and
   a seventh transmission line part electromagnetically coupled with the eighth transmission line part,
wherein each of the fifth transmission line part and the eighth transmission line part includes a near end and a far end, the near end being positioned on a side closer to an end of the fourth transmission line when tracing the fourth transmission line from the end of the fourth transmission line, the far end being positioned on a side farther from the end of the fourth transmission line when tracing the fourth transmission line from the end of the fourth transmission line,
wherein each of the sixth transmission line part and the seventh transmission line part includes a near end and a far end, the near end being positioned on a side closer to an end of the third transmission line when tracing the third transmission line from the end of the third transmission line, the far end being positioned on a side farther from the end of the third transmission line when tracing the third transmission line from the end of the third transmission line,
wherein the third transmission line includes a third connection part where the near end of the fifth transmission line part and the far end of the eighth transmission line part are connected,
wherein the fourth transmission line includes a fourth connection part where the near end of the sixth transmission line part and the far end of the seventh transmission line part are connected,
wherein the switch circuit switches the near end of the third transmission line part to provide the matched termination through the sixth transmission line part and the seventh transmission line part when the first connection part terminates to have the first impedance and the third connection part terminates to have a third impedance smaller than a characteristic impedance of the fifth transmission line part or the eighth transmission line part in a case where the second connection part and the fourth connection part are not short-circuited, and
wherein the switch circuit switches the near end of the fourth transmission line part to provide the matched termination through the fifth transmission line part and the eighth transmission line part when the second connection part terminates to have the second impedance and the second connection part terminates to have a fourth impedance smaller than a characteristic impedance of the sixth transmission line part or the seventh transmission line part in a case where the first connection part and the third connection part are not short-circuited.

22. A communication device comprising:

the directional coupler according to claim 21;

a first single end circuit connected to the far end of the second transmission line part when the near end of the third transmission line part is switched to provide the matched termination through the sixth transmission line part and the seventh transmission line part;

a first differential circuit connected to the far end of the first transmission line part and the near end of the fourth transmission line part when the near end of the third transmission line part is switched to provide the matched termination through the sixth transmission line part and the seventh transmission line part;

a second single end circuit connected to the far end of the fifth transmission line part and the near end of the eighth transmission line part when the near end of the third transmission line part is switched to provide the matched termination through the sixth transmission line part and the seventh transmission line part;

a second differential circuit connected to the far end of the second transmission line part when the near end of the fourth transmission line part is switched to provide the matched termination through the fifth transmission line part and the eighth transmission line part;

a third differential circuit connected to the far end of the second transmission line part and the near end of the third transmission line part when the near end of the fourth transmission line part is switched to provide the matched termination through the fifth transmission line part and the eighth transmission line part; and a fourth differential circuit connected to the far end of the sixth transmission line part and the near end of the seventh transmission line part when the near end of the fourth transmission line part is switched to provide the matched termination through the fifth transmission line part and the eighth transmission line part.

\* \* \* \* \*